US012720739B2

(12) United States Patent
Zhang et al.

(10) Patent No.: US 12,720,739 B2
(45) Date of Patent: Aug. 25, 2026

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Kun Zhang, Wuhan (CN); Lei Liu, Wuhan (CN); Tao Yang, Wuhan (CN); Linchun Wu, Wuhan (CN); Wenxi Zhou, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 813 days.

(21) Appl. No.: 17/747,877

(22) Filed: May 18, 2022

(65) Prior Publication Data

US 2023/0005944 A1 Jan. 5, 2023

Related U.S. Application Data

(63) Continuation of application No. PCT/CN2022/084825, filed on Apr. 1, 2022.

(30) Foreign Application Priority Data

Jun. 30, 2021 (CN) ......................... 202110736147.7

(51) Int. Cl.

*H01L 27/11556* (2017.01)
*H10B 41/27* (2023.01)

(Continued)

(52) U.S. Cl.

CPC ............. *H10B 41/27* (2023.02); *H10B 41/35* (2023.02); *H10B 41/40* (2023.02); *H10B 43/27* (2023.02); *H10B 43/35* (2023.02); *H10B 43/40* (2023.02)

(58) Field of Classification Search

CPC ........ H10B 41/35; H10B 41/40; H10B 43/35; H10B 43/40; H10B 43/50;

(Continued)

(56) References Cited

U.S. PATENT DOCUMENTS

| | | | |
|---|---|---|---|
| 9,461,062 | B1 | 10/2016 | Hu et al. |
| 2012/0112260 | A1 | 5/2012 | Kim et al. |

(Continued)

FOREIGN PATENT DOCUMENTS

| | | | |
|---|---|---|---|
| CN | 103730471 | A | 4/2014 |
| CN | 108649033 | A | 10/2018 |

(Continued)

OTHER PUBLICATIONS

Notice of Reasons for Refusal issued in corresponding Japanese Application No. 2024-124726, mailed on May 13, 2025, 12 pages.

(Continued)

*Primary Examiner* — Cuong B Nguyen
(74) *Attorney, Agent, or Firm* — BAYES PLLC

(57) ABSTRACT

Three-dimensional (3D) memory devices and methods for forming the same are disclosed. In certain aspects, a stack structure includes interleaved dielectric layers and conductive layers, a channel structure extending in the stack structure, and a doped semiconductor layer arranged on the stack structure. The doped semiconductor layer covers an end of the channel structure and the stack structure, the channel structure includes a channel layer, and the channel layer includes a doped channel layer.

20 Claims, 32 Drawing Sheets

(51) Int. Cl.

| | |
|---|---|
| ***H10B 41/35*** | (2023.01) |
| ***H10B 41/40*** | (2023.01) |
| ***H10B 43/27*** | (2023.01) |
| ***H10B 43/35*** | (2023.01) |
| ***H10B 43/40*** | (2023.01) |

(58) Field of Classification Search

CPC ...... H10B 63/84–845; H10B 20/40–65; H10B 53/20; H10B 41/20–27; H10B 43/20–27; H10B 51/20; H01L 24/08; H01L 24/80; H01L 2224/08145; H01L 25/18; H10D 62/60–605; H10D 62/228

See application file for complete search history.

(56) References Cited

U.S. PATENT DOCUMENTS

| | | | | |
|---|---|---|---|---|
| 2013/0092994 | A1 | 4/2013 | Shim et al. | |
| 2016/0204122 | A1 | 7/2016 | Shoji et al. | |
| 2016/0260733 | A1* | 9/2016 | Lue | H10B 43/10 |
| 2018/0130737 | A1* | 5/2018 | Kim | H10B 43/27 |
| 2020/0168619 | A1 | 5/2020 | Zhou et al. | |
| 2020/0312862 | A1 | 10/2020 | Hwang et al. | |
| 2021/0036002 | A1* | 2/2021 | Lee | H10B 43/27 |
| 2021/0057430 | A1 | 2/2021 | Lee | |
| 2021/0217768 | A1* | 7/2021 | Fukuzumi | H10D 64/685 |

FOREIGN PATENT DOCUMENTS

| | | | |
|---|---|---|---|
| CN | 109473442 | A | 3/2019 |
| CN | 111048518 | A | 4/2020 |
| CN | 111146204 | A | 5/2020 |
| CN | 111758164 | A | 10/2020 |
| CN | 112567519 | A | 3/2021 |
| CN | 112687700 | A | 4/2021 |
| CN | 112838097 | A | 5/2021 |
| CN | 112885842 | A | 6/2021 |
| CN | 113035884 | A | 6/2021 |
| CN | 113471212 | A | 10/2021 |
| DE | 102020107902 | A1 | 3/2021 |
| WO | 2021015895 | A1 | 1/2021 |

OTHER PUBLICATIONS

Office action issued in corresponding Chinese Application No. 202110736147.7, mailed Nov. 15, 2021, 9 pages.

Second Office action issued in corresponding German Application No. 11 2022 000 002.3, received Jan. 22, 2025, 13 pages.

International Search Report issued in corresponding International Application No. PCT/CN2022/084825, mailed Jun. 28, 2022, 4 pages.

* cited by examiner

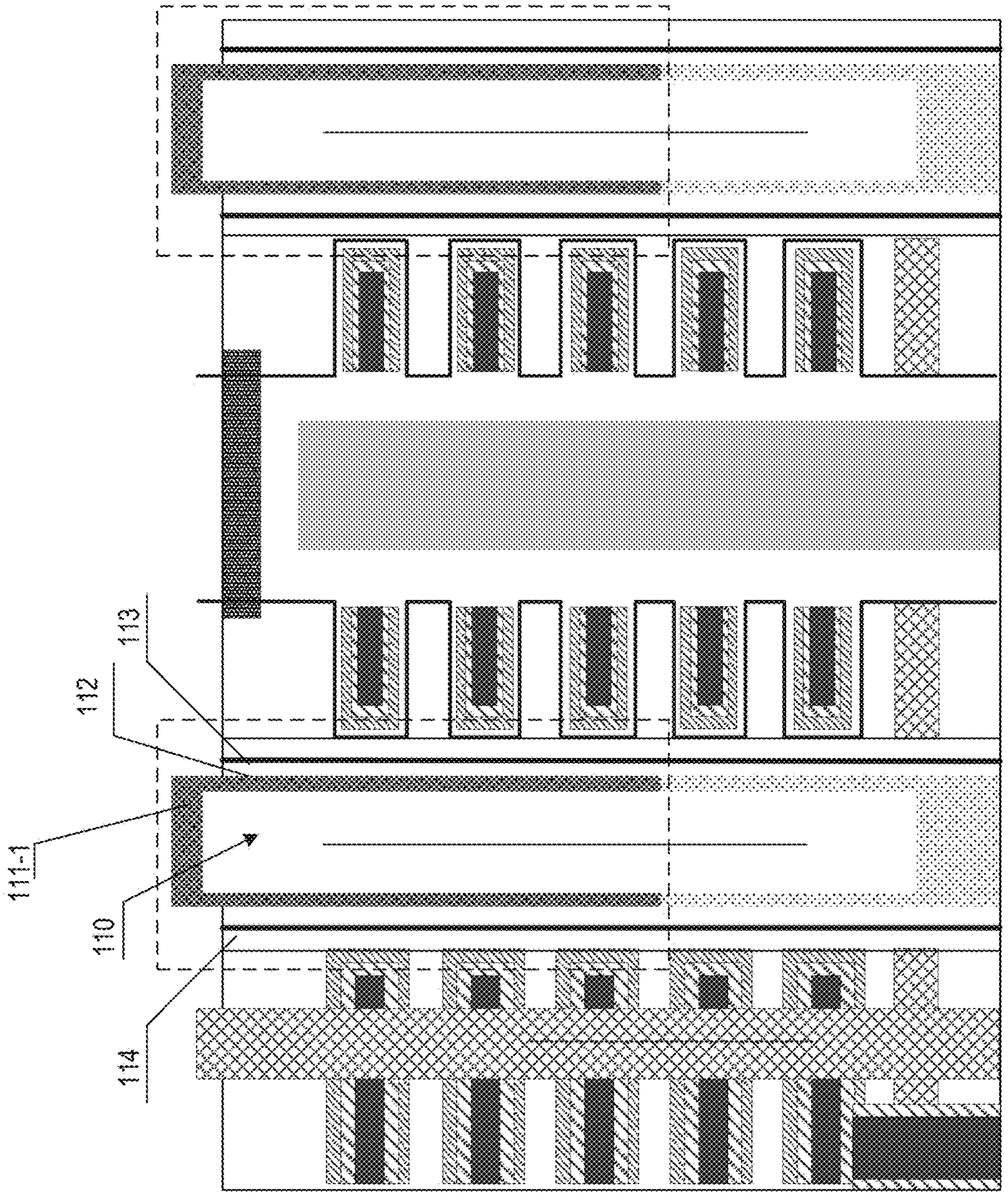
FIG. 5E
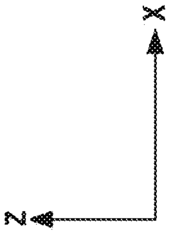

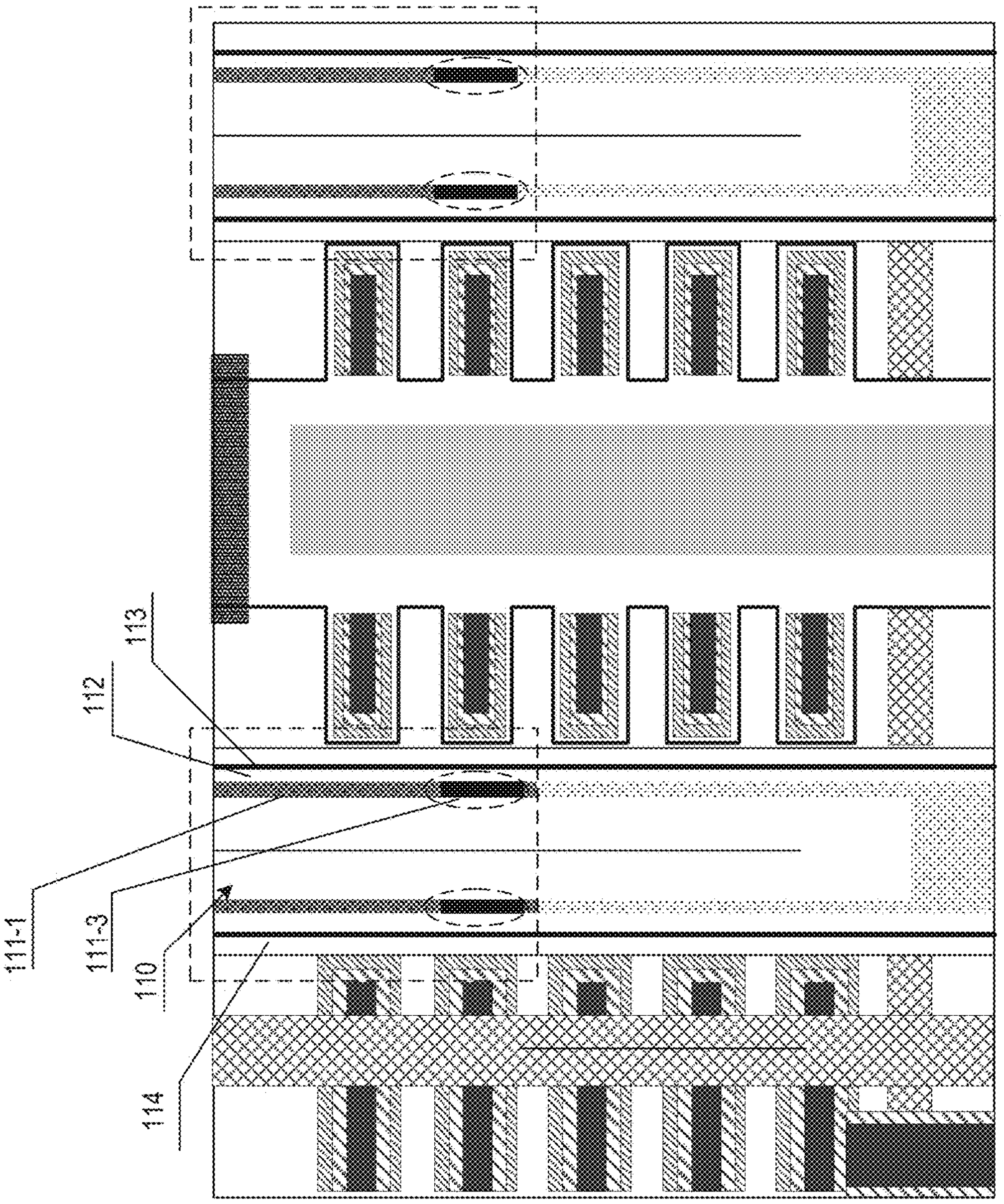
FIG. 13D
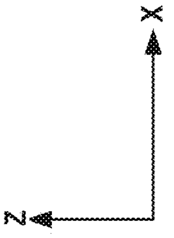

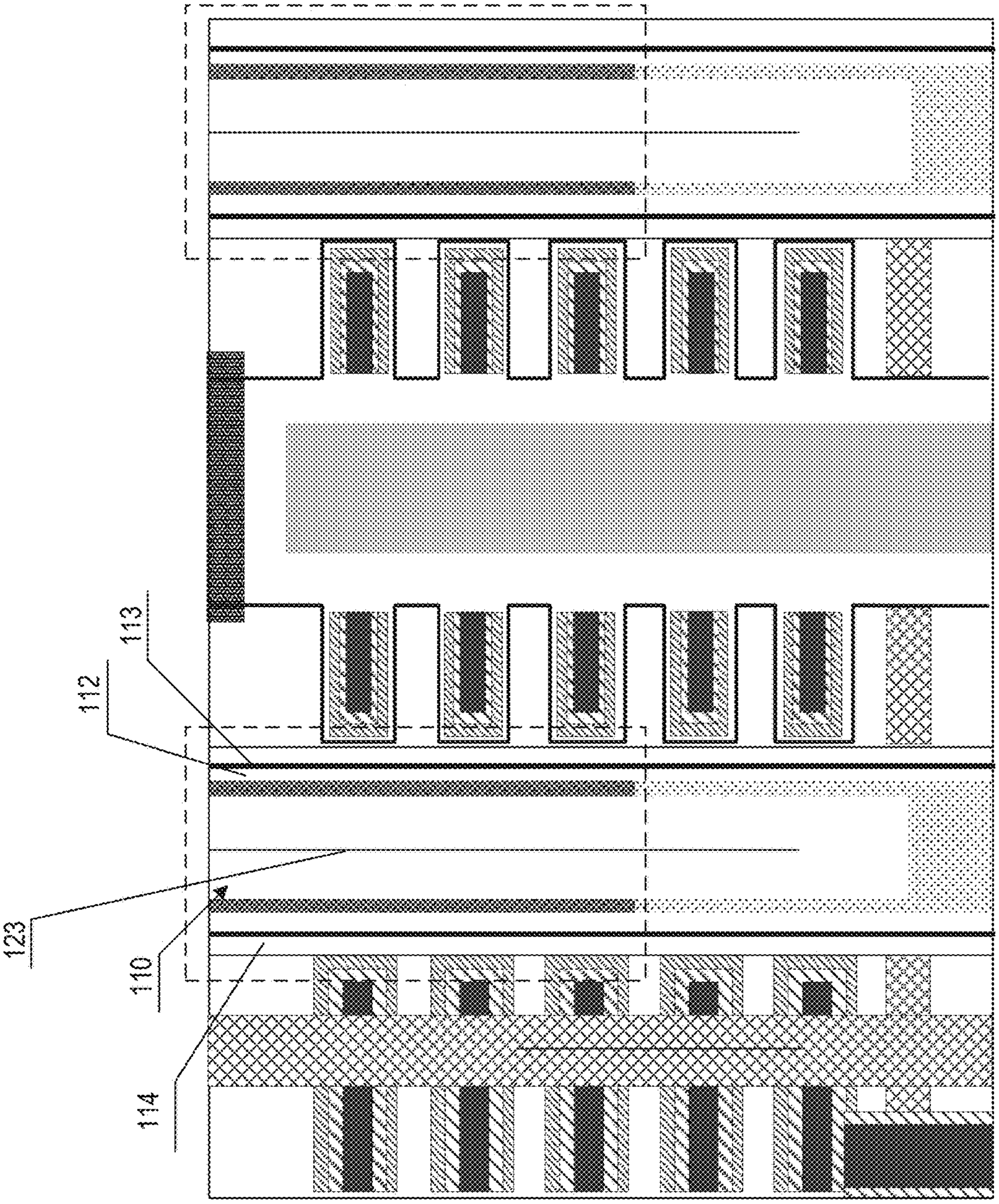
FIG. 13E
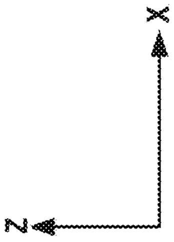

150

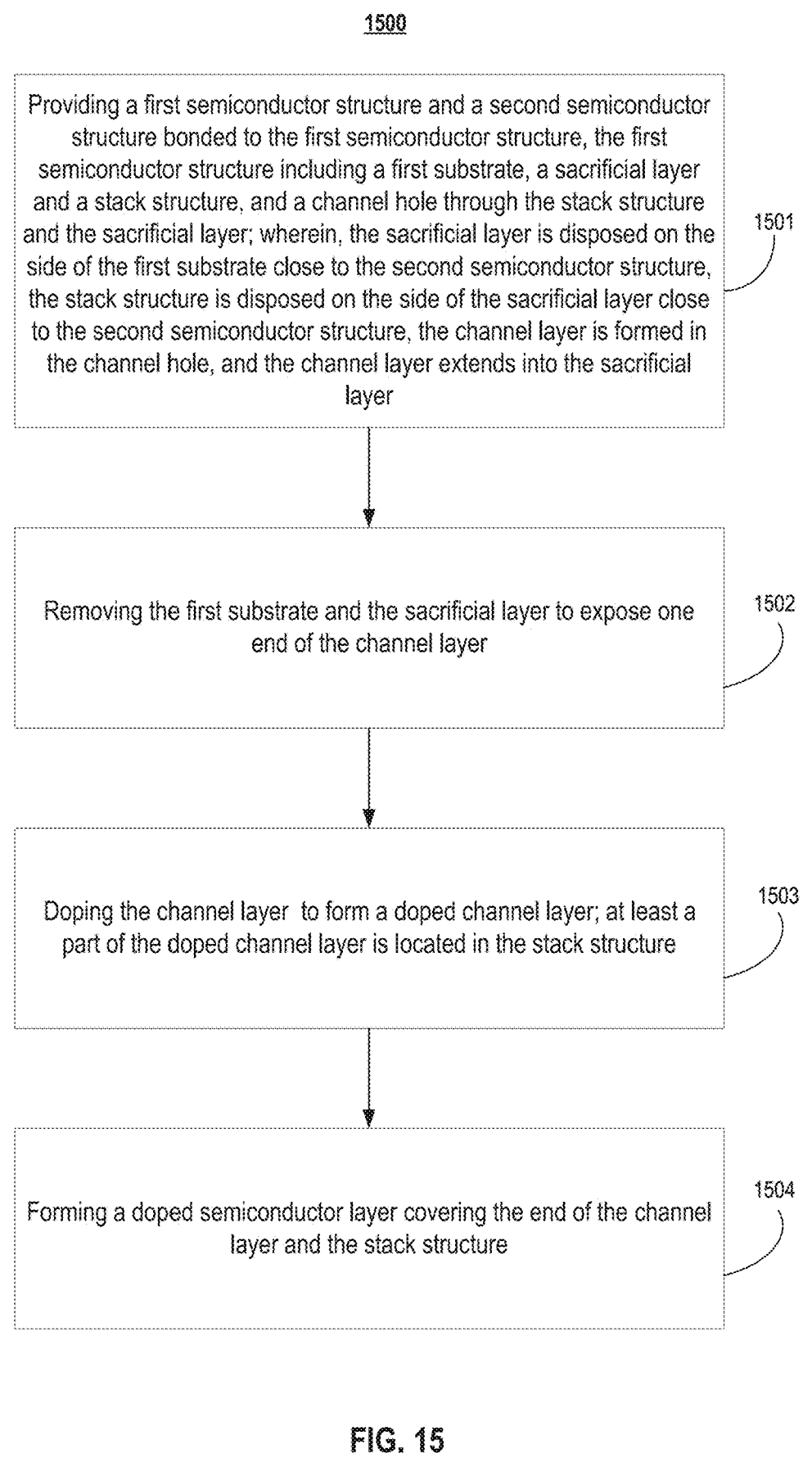

1500

Providing a first semiconductor structure and a second semiconductor structure bonded to the first semiconductor structure, the first semiconductor structure including a first substrate, a sacrificial layer and a stack structure, and a channel hole through the stack structure and the sacrificial layer; wherein, the sacrificial layer is disposed on the side of the first substrate close to the second semiconductor structure, the stack structure is disposed on the side of the sacrificial layer close to the second semiconductor structure, the channel layer is formed in the channel hole, and the channel layer extends into the sacrificial layer — 1501

↓

Removing the first substrate and the sacrificial layer to expose one end of the channel layer — 1502

↓

Doping the channel layer to form a doped channel layer; at least a part of the doped channel layer is located in the stack structure — 1503

↓

Forming a doped semiconductor layer covering the end of the channel layer and the stack structure — 1504

FIG. 15

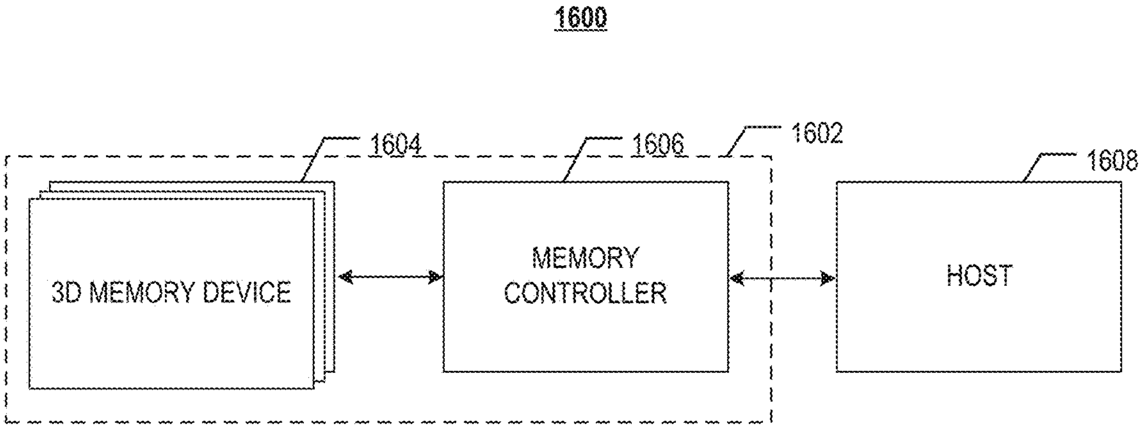
FIG. 16
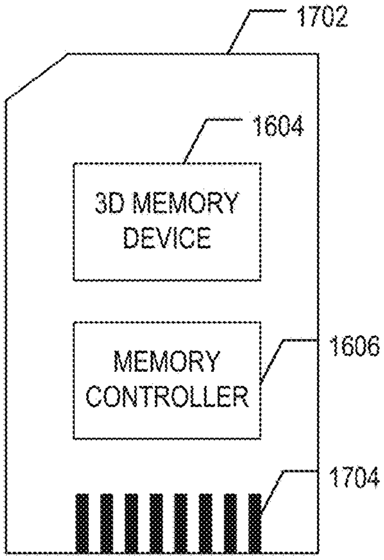
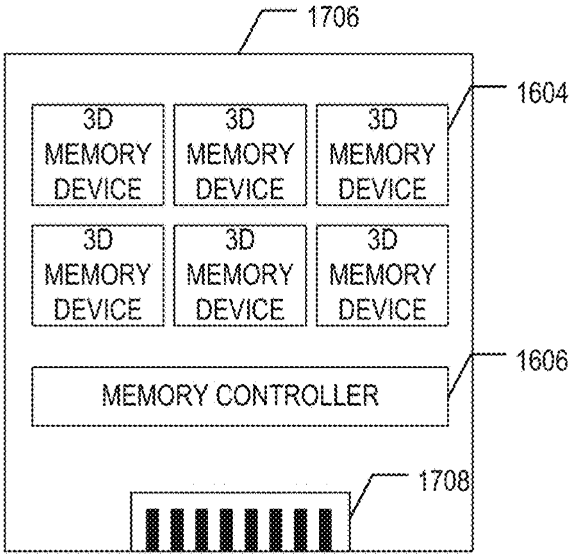
FIG. 17A
FIG. 17B

THREE-DIMENSIONAL MEMORY DEVICES AND METHODS FOR FORMING THE SAME

CROSS-REFERENCE TO RELATED APPLICATIONS

This application is a continuation of International Application No. PCT/CN2022/084825, filed on Apr. 1, 2022, entitled "THREE-DIMENSIONAL MEMORY DEVICES AND METHODS FOR FORMING THE SAME," which claims the benefit of priority to Chinese Application No. 202110736147.7, filed on Jun. 30, 2021, both of which are incorporated herein by reference in their entireties.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

In one aspect, a 3D memory device includes a stack structure including interleaved dielectric layers and conductive layers, a channel structure extending in the stack structure, and a doped semiconductor layer arranged on the stack structure. The doped semiconductor layer covers an end of the channel structure and the stack structure, the channel structure includes a channel layer, and the channel layer includes a doped channel layer.

In some implementations, a doping concentration of the doped channel layer and a doping concentration of the doped semiconductor layer are the same.

In some implementations, a doping concentration of the doped channel layer and a doping concentration of the doped semiconductor layer each is between $10^{13}$ $cm^{-3}$ and $10^{23}$ $cm^{-3}$.

In some implementations, the doped channel layer includes at least two different doping concentration portions.

In some implementations, the doped channel layer includes a first doping portion and a second doping portion, a doping concentration of the first doping portion is higher than that of the second doping portion.

In some implementations, a depth of the first doping portion laterally corresponds to a depth of a first uppermost conductive layer of the interleaved conductive layers, a second uppermost conductive layer of the interleaved conductive layers, or a third uppermost conductive layer of the interleaved conductive layers.

In some implementations, a lower portion of the doped channel layer extends in the stack structure.

In some implementations, an upper portion of the doped channel layer extends in the doped semiconductor layer.

In some implementations, a depth of the portion of the doped channel layer in the stack structure is smaller than a thickness of the stack structure.

In some implementations, the doped channel layer and the doped semiconductor layer each includes N-type doped polysilicon.

In some implementations, the channel layer includes an undoped channel layer. The undoped channel layer is located in the stack structure and below the doped channel layer.

In some implementations, the channel structure extending in the stack structure further includes a storage film. The storage film at least partially surrounds the channel layer. The storage film includes a tunneling layer, a storage layer, and a blocking layer arranged radially from inside out.

In some implementations, the 3D memory device further includes first contacts, and second contacts in the doped semiconductor layer. The first contacts are in contact with ends of peripheral contacts, and the second contacts are electrically connected to the channel structure.

In some implementations, the 3D memory device further includes a first semiconductor structure including the stack structure, the channel structure, and the doped semiconductor layer, and a second semiconductor structure below the first semiconductor structure.

In some implementations, the second semiconductor structure includes a second substrate, and peripheral circuits on the second substrate.

In another aspect, a system includes a memory system including one or more three-dimensional (3D) memory devices, and a memory controller configured to control operations of the 3D memory devices, and a host configured to send or receive data to or from the 3D memory devices. Each 3D memory device includes a stack structure including interleaved dielectric layers and conductive layers, a channel structure extending in the stack structure, and a doped semiconductor layer arranged on the stack structure. The doped semiconductor layer covers an end of the channel layer and the stack structure, the channel structure includes a channel layer, and the channel layer includes a doped channel layer.

In still another aspect, a method for forming a three-dimensional (3D) memory device includes providing a first semiconductor structure and a second semiconductor structure bonded to the first semiconductor structure. The first semiconductor structure includes a first substrate, a sacrificial layer, a stack structure, and a channel structure extending in the stack structure and the sacrificial layer. The sacrificial layer is disposed on a side of the first substrate close to the second semiconductor structure. The stack structure is disposed on a side of the sacrificial layer close to the second semiconductor structure. The method further includes removing the first substrate and the sacrificial layer to expose an end of the channel structure, the channel structure includes a channel layer. The method further includes doping the channel layer to form a doped channel layer. At least a portion of the doped channel layer extends in the stack structure. The method further includes forming a doped semiconductor layer covering the end of the channel structure and the stack structure.

In some implementations, the method further includes activating the doped channel layer and the doped semiconductor layer. The doped channel layer and the doped semiconductor layer after the activation have the same doping concentration.

In some implementations, the activation includes a thermal activation or a laser activation.

In some implementations, the doped channel layer is formed by an ion implantation process, and the doped semiconductor layer is formed by an in-situ growth process.

In some implementations, the first substrate and the sacrificial layer are removed by a wet etching process, or by a chemical mechanical polishing process.

In some implementations, in response to the first substrate and the sacrificial layer are removed by the chemical mechanical polishing process, a portion of the channel layer extended in the sacrificial layer is removed.

In some implementations, after the first substrate and the sacrificial layer are removed, an air gap in the end of the channel layer is exposed.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 5A-5F illustrate a fabrication process for forming an exemplary 3D memory device, according to some aspects of the present disclosure.

FIGS. 13A-13F illustrate a fabrication process for forming an exemplary 3D memory device, according to some aspects of the present disclosure.

FIG. 15 illustrates a flowchart of an exemplary method for forming a 3D memory device, according to some aspects of the present disclosure.

FIG. 16 illustrates a block diagram of an exemplary system having a 3D memory device, according to some aspects of the present disclosure.

FIG. 17A illustrates a diagram of an exemplary memory card having a 3D memory device, according to some aspects of the present disclosure.

FIG. 17B illustrates a diagram of an exemplary solid-state drive (SSD) having a 3D memory device, according to some aspects of the present disclosure.

Figure 1:
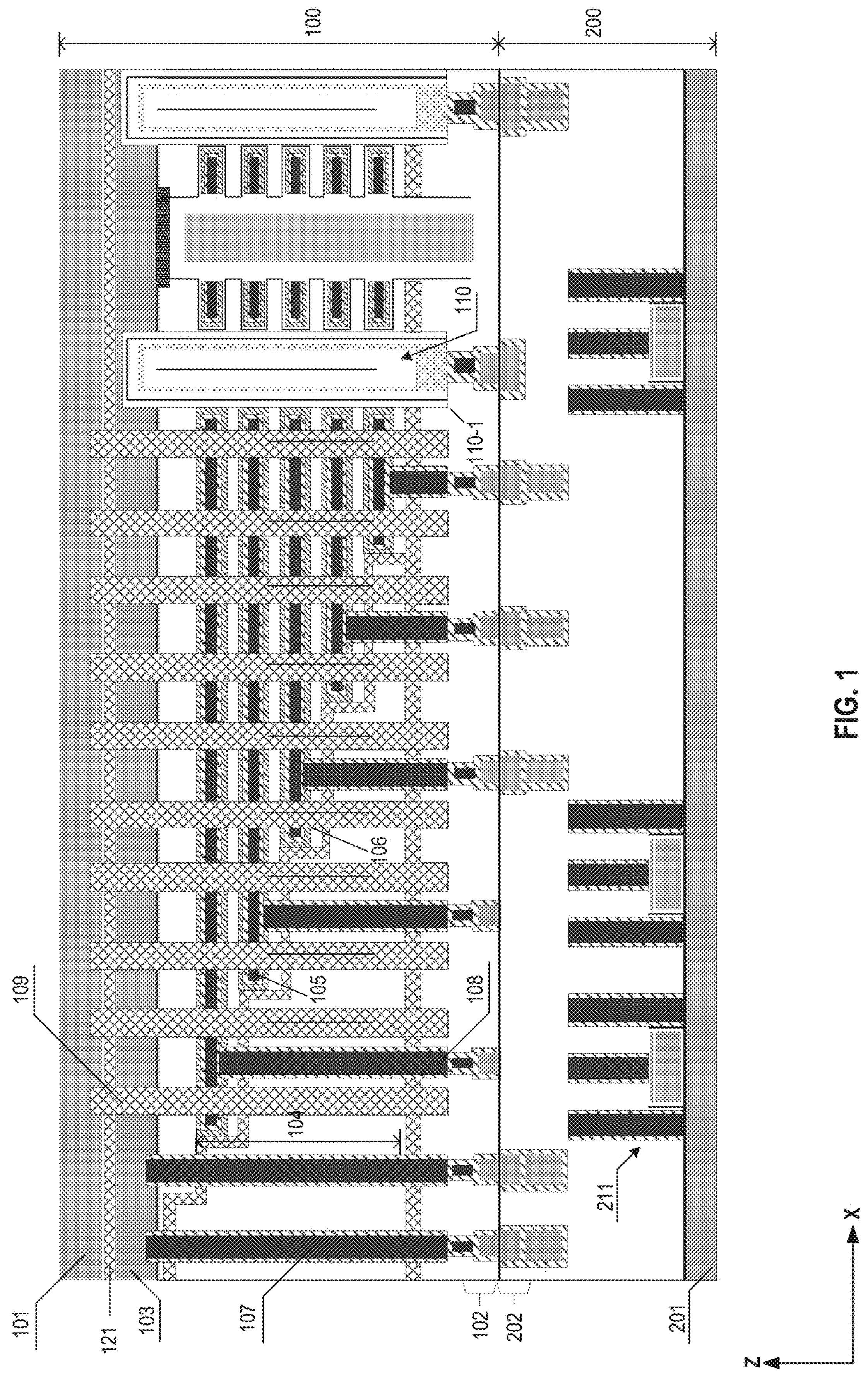
FIGS. 1-4 illustrate a fabrication process for forming an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

In some 3D NAND memory devices, a semiconductor layer is selectively grown to surround the sidewalls of channel structures, e.g., known as sidewall selective epitaxial growth (SEG). Compared with another type of semiconductor layer that is epitaxial growth at the source end of the channel structures, e.g., bottom SEG, the formation of sidewall SEG avoids the etching of the memory film and the semiconductor channel at the bottom surface of channel holes (a.k.a. SONO punch), thereby increasing the process window, in particular when fabricating 3D NAND memory devices with advanced technologies, such as having 90 or more levels with a multi-deck architecture.

However, because intrinsic (pure, undoped) semiconductor materials, such as intrinsic polysilicon, are used to form the semiconductor channel, a relatively high potential barrier exists between the semiconductor channel and the sidewall SEG or the conductive layer in contact with the semiconductor channel, thereby introducing high contact resistance therebetween. The electric performance of the 3D memory device can be affected by the high contact resistance.

To address one or more of the aforementioned issues, the present disclosure introduces a solution in which the contact resistance between the semiconductor channel and the sidewall SEG or the conductive layer can be reduced. In some implementations, the semiconductor channel is partially doped, such that part of the semiconductor channel that forms the source contact is highly doped to lower the potential barrier while leaving another part of the semiconductor channel that forms the memory cells remaining undoped or lowly doped. In some implementations, one end of each channel structure is opened from the backside to expose the doped part of the respective semiconductor channel, and the 3D memory device further includes a doped semiconductor layer electrically connecting the exposed doped parts of the semiconductor channels to further reduce the contact resistance and sheet resistance. For example, the doped semiconductor layer may include a plug extending the channel structure by replacing part of the capping layer of the channel structure to increase the contact area and further reduce contact resistance. As a result, the electric performance of the 3D memory devices can be improved.

Consistent with the scope of the present disclosure, the doped part of the semiconductor channel and the doped semiconductor layer can be locally activated, e.g., through local annealing, to activate the dopants therein without damaging other parts on the device chip that are sensitive to heat, such as the bonding interface and copper interconnects. For example, the heat for activating the dopants may be confined in an area that excludes thermal-sensitive components on the device chip. In some implementations, the local activation process also serves as an in-situ doping process to dope part of the intrinsic semiconductor channel that is in contact with the doped semiconductor layer. This in-situ doping process can further reduce contact resistance and increase the performance of the device.

Furthermore, the doped part of the semiconductor channel may be formed and controlled in a specific location of the semiconductor channel, e.g., in a first area of the semiconductor channel corresponding to the location of a first gate electrode, or in a second area of the semiconductor channel corresponding to the location of a second gate electrode. As such, the gate-induced drain leakage (GIDL) effect can be enhanced.

Figure 14A:
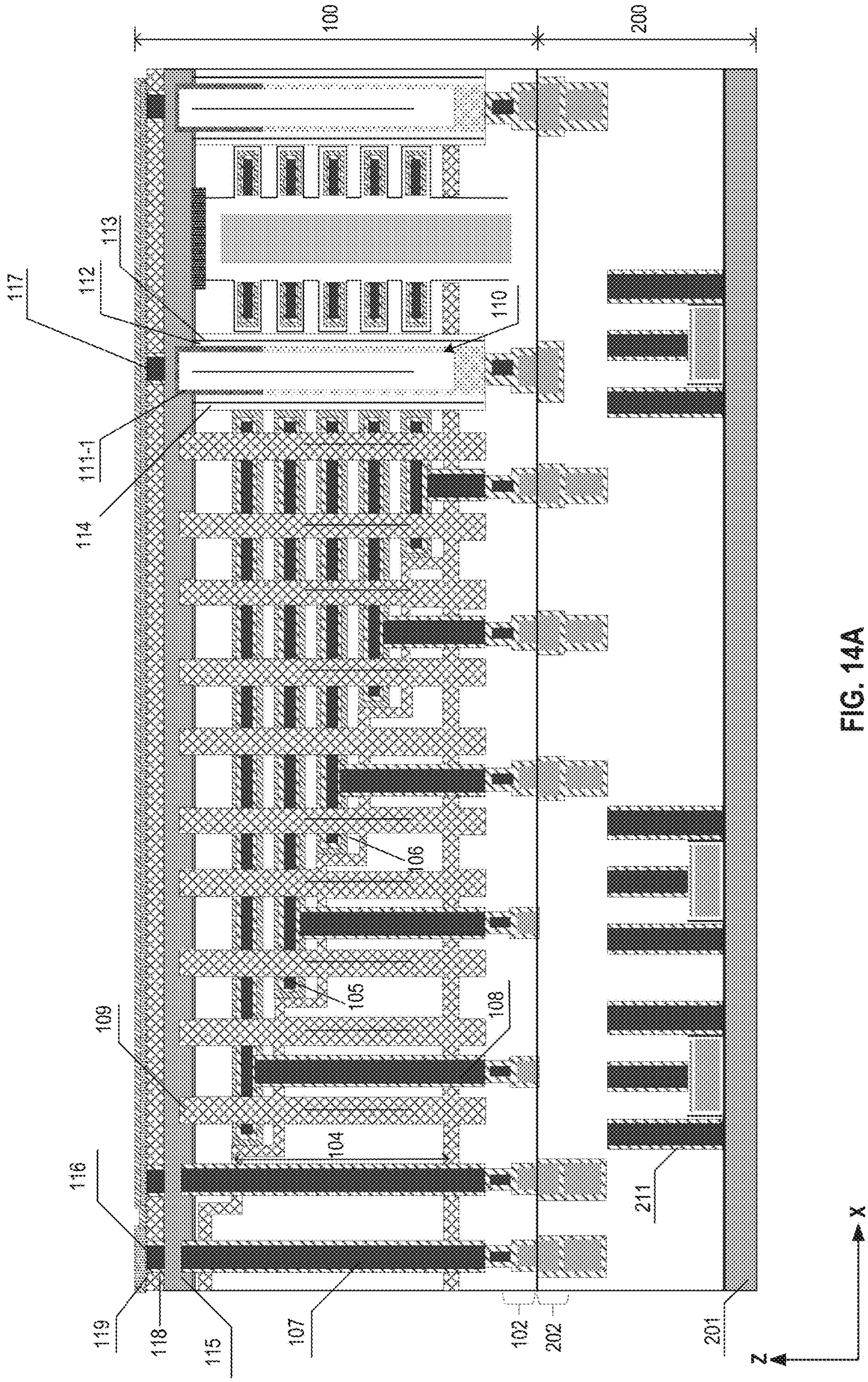
FIGS. 14A-14B illustrate an exemplary 3D memory device, according to some aspects of the present disclosure.
Figure 14B:
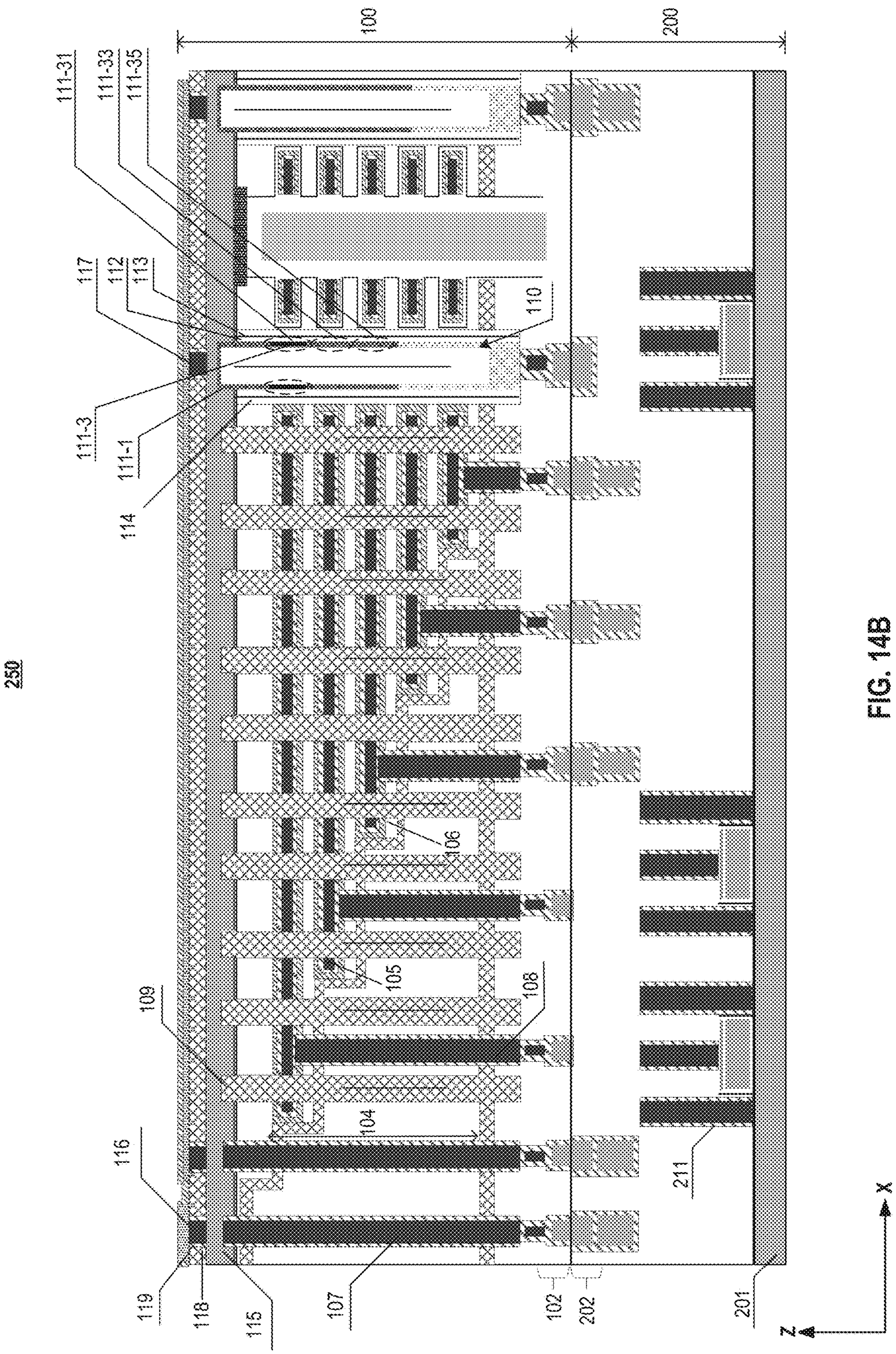

FIGS. 1-4 illustrate a fabrication process for forming an exemplary 3D memory device, according to some aspects of the present disclosure. FIG. 15 illustrates a flowchart of an exemplary method for forming a 3D memory device, according to some aspects of the present disclosure. FIGS. 14A-14B illustrate an exemplary 3D memory device, according to some aspects of the present disclosure. Examples of the 3D memory device depicted in FIGS. 1-4 include 3D memory devices 150 or 250 depicted in FIG. 14A-14B. FIGS. 1-4 and 15 will be described together. It is understood that the operations shown in method 1500 are not exhaustive and that other operations can be performed as well before, after, or between any of the illustrated operations. Further, some of the operations may be performed simultaneously, or in a different order than shown in FIG. 15.

Referring to FIG. 15, method 1500 starts at operation 1501, in which a first semiconductor structure and a second semiconductor structure that are bonded to each other are provided. The first semiconductor structure including a first substrate, a sacrificial layer, and a stack structure. A channel hole penetrates through the stack structure and/or the sacrificial layer. The sacrificial layer is disposed on the side of the first substrate close to the second semiconductor structure, and the stack structure is disposed on the side of the sacrificial layer close to the second semiconductor structure. The channel structure is formed in the channel hole, and the channel structure extends into the sacrificial layer. The first substrate can be a silicon substrate. As illustrated in FIG. 1, a first semiconductor structure 100 and a second semiconductor structure 200 that are bonded to each other are provided. First semiconductor structure 100 including a first substrate 101, a sacrificial layer 103, and a stack structure 104. First substrate 101 can be a silicon substrate. It is understood that since first substrate 101 will be removed from the final product, first substrate 101 may be part of a dummy wafer, for example, a carrier substrate, made of any suitable materials, such as glass, sapphire, plastic, silicon, to name a few, to reduce the cost of first substrate 101. In some implementations, first substrate 101 is a carrier substrate. In some implementations, stack structure 104 includes a dielectric stack having interleaved stack dielectric layers 106 and stack sacrificial layers (not shown). The stack sacrificial layers may be replaced by stack conductive layers 105 by applying a gate replacement process in which a slit is formed by etching through stack structure 104, the stack sacrificial layers are removed by selectively etching away, and then the vacancy of the stack sacrificial layers being etching away will be replaced by stack conductive layers 105 by depositing stack conductive layers 105 in the vacancy. It is understood that in some examples, the stack structure may include a stack structure having interleaved stack dielectric layers (e.g., silicon oxide layers) and stack conductive layers (e.g., polysilicon layers) without using the gate replacement process. It is noted that, in some implementations, only the first semiconductor structure including the first substrate, the sacrificial layer, and the stack structure is provided, and there is no second semiconductor structure. The sacrificial layer may be removed by wet etching from a lateral side of a wafer that includes one or more first semiconductor structures. The vacancy of the sacrificial layer is then filled by depositing a doped filling layer (e.g., doped polysilicon) into the vacancy. The doped filling layer can be work as the doped semiconductor layer mentioned in the present disclosure. The dopants in the doped filling layer can be diffused into the channel layer to form the doped channel layer mentioned in the present disclosure.

A sacrificial layer 103 is formed below first substrate 101, and stack structure 104 is formed below sacrificial layer 103. The sacrificial layer and stack structure can be formed on the front side of the first substrate on which semiconductor devices can be formed. To better control the gauging and surface flatness of various structures to be formed on the first substrate, a variety of stop layers can be formed between the first substrate and the sacrificial layer. In some implementations, a first stop layer and a second stop layer are sequentially formed between the first substrate and the sacrificial layer. The first stop layer can include silicon oxide or silicon nitride, and the second stop layer can include silicon oxide or polysilicon. In some implementations, a third stop layer, such as a silicon nitride layer or a polysilicon layer, is formed between the second stop layer and the sacrificial layer. In some implementations, a stop layer 121, such as a silicon oxide layer or a high-k dielectric layer, is formed between the second substrate and the sacrificial layer.

Also, as illustrated in FIG. 1, a plurality of transistors 211 are formed on a second substrate 201 using a plurality of processes including, but not limited to, photolithography, etching, thin film deposition, thermal growth, implantation, chemical mechanical polishing (CMP), and any other suitable processes. Second substrate 201 can include silicon (e.g., single crystalline silicon, c-Si), silicon germanium (SiGe), gallium arsenide (GaAs), germanium (Ge), silicon-on-insulator (SOI), or any other suitable materials. In some implementations, doped regions (not shown) are formed in second substrate 201 by ion implantation and/or thermal diffusion, which function, for example, as source regions and/or drain regions of transistors 211. In some implementations, isolation regions, e.g., shallow trench isolations (STIs), are also formed in second substrate 201 by wet etching and/or dry etching and thin film deposition. Transistors 211 can form peripheral circuits on second substrate 201. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some implementations. It is understood that in some implementations, the peripheral circuits may further include any other circuits compatible with the advanced logic processes including logic circuits, such as processors and programmable logic devices (PLDs), or memory circuits, such as static random-access memory (SRAM) and dynamic RAM (DRAM).

It is noted that x and y axes are included in FIG. 1 to further illustrate the spatial relationship of the components in the 3D memory device having second substrate 201. Second substrate 201 includes two lateral surfaces (e.g., a top surface and a bottom surface) extending laterally in the x-direction (i.e., the lateral direction). As used herein, whether one component (e.g., a layer or a device) is on, above, or below another component (e.g., a layer or a device) of a semiconductor device (e.g., 3D memory device) is determined relative to the substrate of the semiconductor device (e.g., substrate 201) in the z-direction (i.e., the vertical direction) when the substrate is positioned in the lowest plane of the semiconductor device in the z-direction. The same notion for describing spatial relationships is applied throughout the present disclosure.

As illustrated in FIG. 1, a second bonding layer 202 is formed above peripheral circuits. And a first bonding layer 102 is formed below memory circuits. First and second bonding layers 102, 202 may include bonding contacts electrically connected to peripheral circuits or memory circuits, respectively. To form first and second bonding layer 102, 202, an interlayer dielectric (ILD) layer is deposited using one or more thin film deposition processes, such as chemical vapor deposition (CVD), physical vapor deposition (PVD), atomic layer deposition (ALD), or any combination thereof; the bonding contacts through the ILD layer are formed using wet etching and/or dry etching, e.g., reactive ion etching (RIE), followed by one or more thin film deposition processes, such as ALD, CVD, PVD, any other suitable processes, or any combination thereof. Second semiconductor structure 200 can be bonded to first semiconductor structure 100 in a face-to-face manner at a bonding interface. In some implementations, the bonding interface is disposed between bonding layers 102 and 202 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, the bonding interface is the place at which bonding layers 102 and 202 are met and bonded. In practice, the bonding interface can be a layer with a certain thickness that includes the bottom surface of bonding layer 102 of first semiconductor structure 100 and the top surface of bonding layer 202 of second semiconductor structure 200.

In some implementations, first semiconductor structure 100 of the 3D memory device further includes interconnect layers and contacts (e.g., peripheral contact 107 and memory interconnect layer 108) above peripheral circuits to transfer electrical signals to and from peripheral circuits. Peripheral contact 107 extends vertically outside of stack structure 104. A depth of peripheral contact 107 can be larger than that of stack structure 104. Peripheral contact 107 can further extend into the sacrificial layer 103. Peripheral contact 107 can be connected to peripheral circuits in second semiconductor structure 200 via bonding layers 102 and 202. The interconnect layer can include a plurality of interconnects (also referred to herein as contacts), including lateral interconnect lines and vertical interconnect access (VIA) contacts. As used herein, the term interconnects can broadly include any suitable types of interconnects, such as middle-end-of-line (MEOL) interconnects and back-end-of-line (BEOL) interconnects. The interconnect layer can further include one or more ILD layers (a.k.a. intermetal dielectric (IMD) layers) in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

In some implementations, the 3D memory device is a NAND Flash memory device in which memory cells are provided in the form of an array of NAND memory strings. Each NAND memory string can include a respective channel structure 110. As shown in FIG. 1A, each channel structure 110 can extend vertically through a plurality of pairs each including a stack conductive layer 105 and a stack dielectric layer 106. The interleaved stack conductive layers 105 and stack dielectric layers 106 are part of a stack structure 104. The number of the pairs of stack conductive layers 105 and stack dielectric layers 106 in stack structure 104 determines the number of memory cells in the 3D memory device. It is understood that in some implementations, stack structure 104 may have a multi-deck architecture (not shown), which includes a plurality of memory decks stacked over one another. The numbers of the pairs of stack conductive layers 105 and stack dielectric layers 106 in each memory deck can be the same or different.

Stack structure 104 can include a plurality of interleaved stack conductive layers 105 and stack dielectric layers 106. Stack conductive layers 105 and stack dielectric layers 106 in stack structure 104 can alternate in the vertical direction. In other words, except the ones at the top or bottom of stack structure 104, each stack conductive layer 105 can be adjoined by two stack dielectric layers 106 on both sides, and each stack dielectric layer 106 can be adjoined by two stack conductive layers 105 on both sides. Stack conductive layers 105 can include conductive materials including, but not limited to, W, Co, Cu, Al, polysilicon, doped silicon, silicides, or any combination thereof. Each stack conductive layer 105 can include a gate electrode (gate line) surrounded by an adhesive layer and a gate dielectric layer. The gate electrode of stack conductive layer 105 can extend laterally as a word line, ending at one or more staircase structures of stack structure 104. Stack dielectric layers 106 can include dielectric materials including, but not limited to, silicon oxide, silicon nitride, silicon oxynitride, or any combination thereof.

As shown in FIG. 1, first semiconductor structure 100 of the 3D memory device can also include a sacrificial layer 103 above stack structure 104. Sacrificial layer 103 can include polysilicon, a high dielectric constant (high-k) dielectric, or a metal. For example, a high-k dielectric may include any dielectric materials having a dielectric constant higher than that of silicon oxide (e.g., k>3.7). Different from some known solutions in which sacrificial layer 103 acts as the sidewall SEGs surrounding channel structure 110 and/or a conductive layer electrically connecting channel structure 110, such as a doped polysilicon layer, sacrificial layer 103 in first semiconductor structure 100 of the 3D memory device may not work as the sidewall SEGs and/or the conductive layer and thus, may include materials other than doped polysilicon, such as dielectrics (e.g., high-k dielectrics), metals (e.g., W, Co, Cu, or Al), metal silicides, or undoped polysilicon. It is understood that in some examples, sacrificial layer 103 may include doped polysilicon as well.

In some implementations, each channel structure 110 includes a channel hole filled with a channel layer 111 (e.g., as a semiconductor channel) and a composite dielectric layer (e.g., as a memory film). In some implementations, channel layer 111 includes silicon, such as amorphous silicon, polysilicon, or single crystalline silicon. In some implementations, the memory film is a composite layer including a tunneling layer (e.g., 112 in FIG. 14A), a storage layer (e.g., 113 in FIG. 14A, also known as a "charge trap layer"), and a blocking layer (e.g., 114 in FIG. 14A). As shown in FIG. 1, the remaining space of the channel hole can be partially filled with a capping layer including dielectric materials, such as silicon oxide, and/or an air gap (not shown). Channel structure 110 can have a cylinder shape (e.g., a pillar shape). The capping layer, the semiconductor channel, the tunneling layer, the storage layer, and the blocking layer of the memory film are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, the memory film can include a composite layer of silicon oxide/silicon oxynitride/silicon oxide (ONO).

Figure 2:
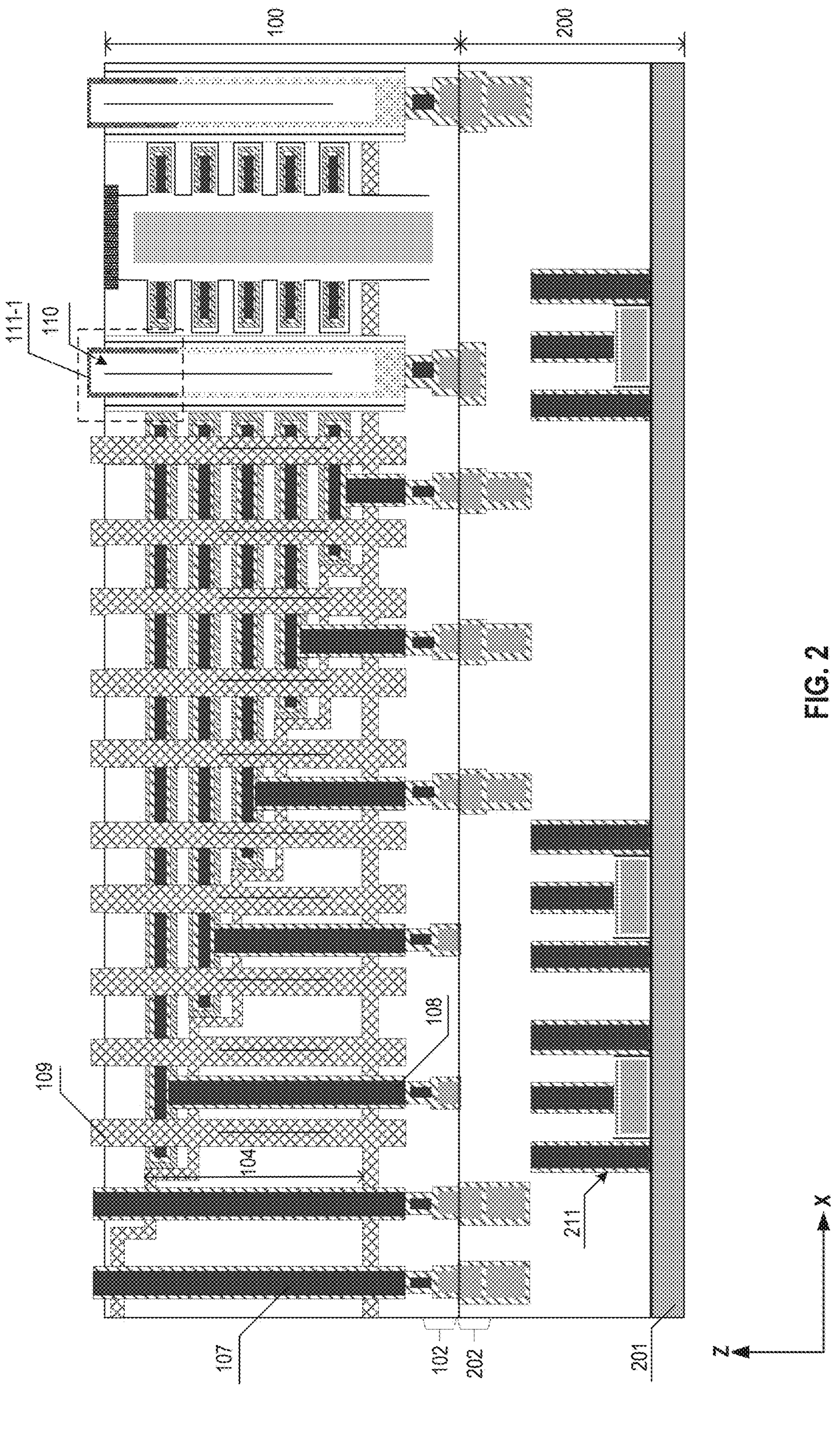

Method 1500 proceeds to operation 1502, as illustrated in FIG. 15, in which the first substrate and the sacrificial layer are removed to expose one end of the channel layer. As illustrated in FIG. 2, the removal of first substrate 101, stop layer 121, and sacrificial layer 103, as shown in FIG. 1, is performed from the backside of first substrate 101 to expose one end of channel structure 110. In some implementations, first substrate 101, stop layer 121, and sacrificial layer 103 are removed through a wet etching process to expose the end of the channel layer. Due to the selectivity of the wet etching process, only first substrate 101, stop layer 121, and sacrificial layer 103 can be removed by the etching, and dummy channel layers 109 are not etched. That is, at this time, the top surface of the memory device presents an uneven surface. In some implementations, first substrate 101 can be removed by peeling off first substrate 101 using other processes such as removing sacrificial layer 103 or stop layer 121 to peel off first substrate 101. Afterward, sacrificial layer 103 can also be selectively removed using a wet etch with an appropriate etchant (e.g., hydrofluoric acid) without etching the underlying first semiconductor structure 100. As described above, removal of first substrate 101 does not affect channel structure 110 because channel structure 110 does not extend beyond sacrificial layer 103 into first substrate 101. As such, the removal of sacrificial layer 103 can expose the end of channel structure 110. In some implementations, channel structure 110 may extend into sacrificial layer 103. The selective etching of sacrificial layer 103, which includes silicon oxide, also removes a portion of stop layer 121, which also includes silicon oxide, above the top surface of the stack structure. The tunneling layer (e.g., 112 in FIG. 5A), the storage layer (e.g., 113 in FIG. 5A), and the blocking layer (e.g., 114 in FIG. 5A) remain intact.

In some implementations, the stop layer, the storage layer, and the tunneling layer may be selectively removed by a wet etching process without etching the channel layer. In some implementations, wet etching is used to selectively remove the storage layer including silicon nitride, without etching the tunneling and channel layers using a suitable etchant such as phosphoric acid. The tunneling layer surrounding the channel layer at the end of the channel hole can be removed. In some implementations, the tunneling layer (which includes silicon oxide) is selectively removed without etching the channel layer (which includes polysilicon) using a wet etch using a suitable etchant such as hydrofluoric acid.

Method 1500 proceeds to operation 1503, as illustrated in FIG. 15, in which the channel layer is doped to form a doped channel layer, and at least a portion of the doped channel layer is located in the stack structure. As illustrated in FIG. 2, a portion of the channel layer of channel structure 110 is doped to form a doped channel layer 111-1. And at least a portion of doped channel layer 111-1 is located in stack structure 104. In some implementations, since the end of the channel layer is exposed, the channel layer may be doped by using an ion implantation process. In the ion implantation process, dopant ions are injected into the channel layer in the form of ion beams, and the high-energy ions lose energy due to collisions with electrons and nuclei in the channel layer, and finally stop at a certain depth in the lattice.

Figure 5A:
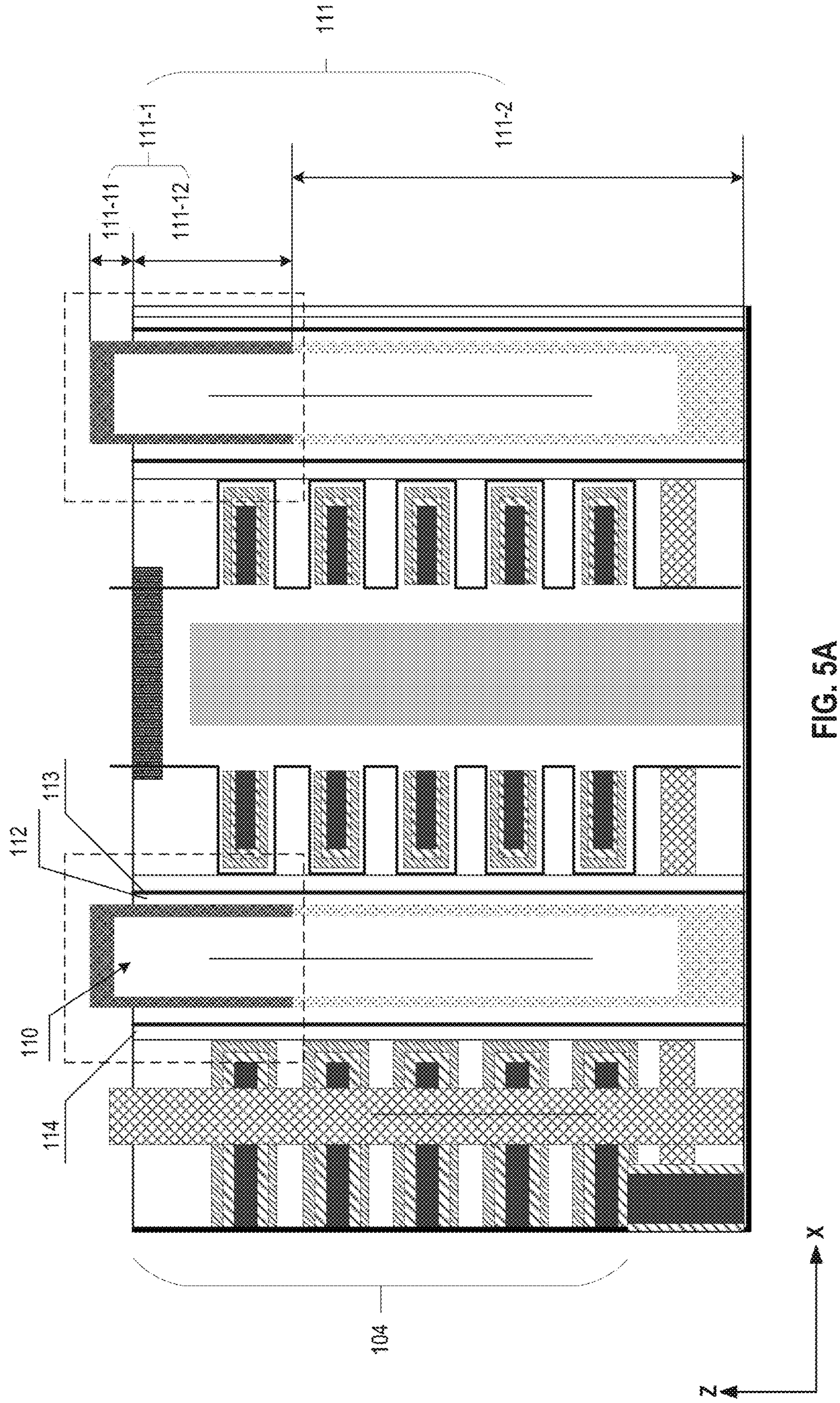

FIG. 5A further shows a partially enlarged view for illustrating the doping profile of channel layer 111 after being doped in FIG. 2. As shown in FIG. 5A, channel layer 111 may include a doped channel layer 111-1 and an undoped channel layer 111-2. Undoped channel layer 111-2 may be located below doped channel layer 111-1. Doped channel layer 111-1 may include a first portion of doped channel layer 111-11, which is located on the top of channel layer 111, and a second portion of doped channel layer 111-12, which extended and located in stack structure 104. A depth of second portion 111-12 is less than that of stack structure 104. It is noted that, by using the ion implantation to dope the channel layer, a doping depth may be an ion implantation depth. As such, the ion implantation depth can be adjusted to control the doping depth of the doped channel layer 111-1 accordingly. It is also noted that the doping depth of the doping channel layer is not limited to the present disclosure, different doping depths, doping concentrations, or doping profiles can be set according to the actual requirements of the memory device. Among them, the doping depth can be controlled by adjusting the acceleration energy of the ion beam. The doping concentration, that is, the impurity dose, can be controlled by monitoring the ion current during implantation. The doping impurity distribution can be adjusted by simultaneously adjusting the ion implantation energy and ion implantation dose to control. Therefore, by using the ion implantation process for doping, the doping concentration, doping depth, and doping impurity distribution can be controlled more accurately with repeatability. In some implementations, the doping concentration of doped channel layer 111-1 can be between $1\times10^{13}$ $cm^{-3}$ and $1\times10^{23}$ $cm^{-3}$ (e.g., $1\times10^{13}$, $1\times10^{14}$, $1\times10^{15}$, $1\times10^{16}$, $1\times10^{17}$, $1\times10^{18}$, $1\times10^{19}$, $1\times10^{20}$, $1\times10^{21}$, $1\times10^{22}$, $1\times10^{23}$, or any range bounded by the lower end by any of these values, or in any range defined by any two of these values). In some implementations, the depth of doped channel layer 111-1 can be between 0 nm and 500 nm (e.g., 50 nm, 100 nm, 150 nm, 200 nm, 250 nm, 300 nm, 350 nm, 400 nm, 450 nm, 500 nm, or any range bounded by the lower end by any of these values, or in any range defined by any two of these values).

In some implementations, doped channel layer 111-1 may be an N-type doped channel layer. Specifically, the N-type doped channel layer may include, for example, polysilicon, single crystal silicon, or amorphous silicon. The N-type doped channel layer may include a pentavalent impurity element such as phosphorus (P), arsenic (As), or antimony (Tb) as an N-type dopant. Since only four valence electrons in the pentavalent impurity atom can form covalent bonds with the valence electrons in the surrounding four semiconductor atoms, the extra valence electron can easily form a free electron because it is not bound by covalent bonds. Therefore, the N-type doped channel layer can provide free electrons. In some implementations, an ion implantation process is employed to dope the upper end of the channel layer with any suitable N-type dopant to a desired doping depth and doping concentration.

Figure 5B:
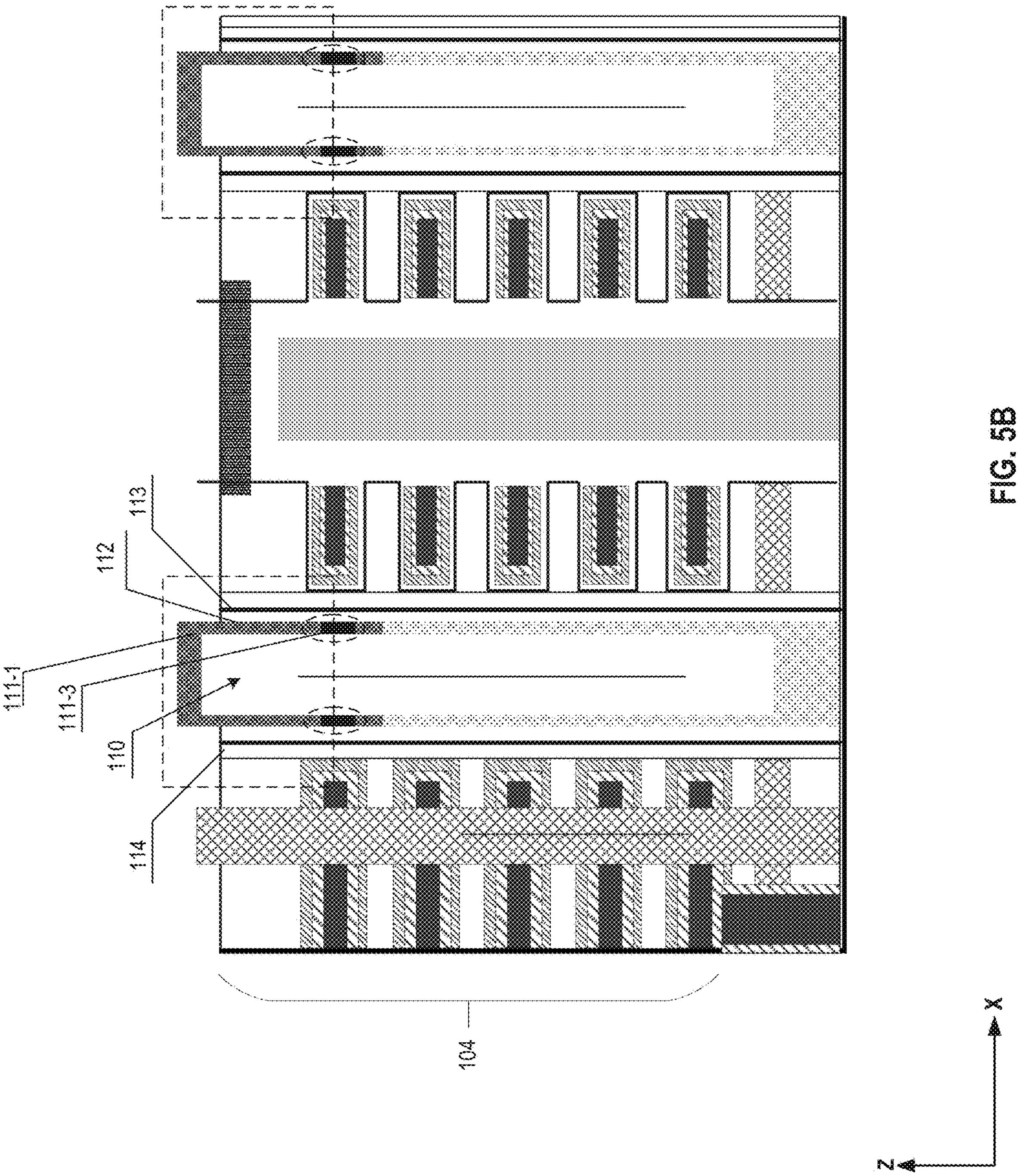
Figure 5C:
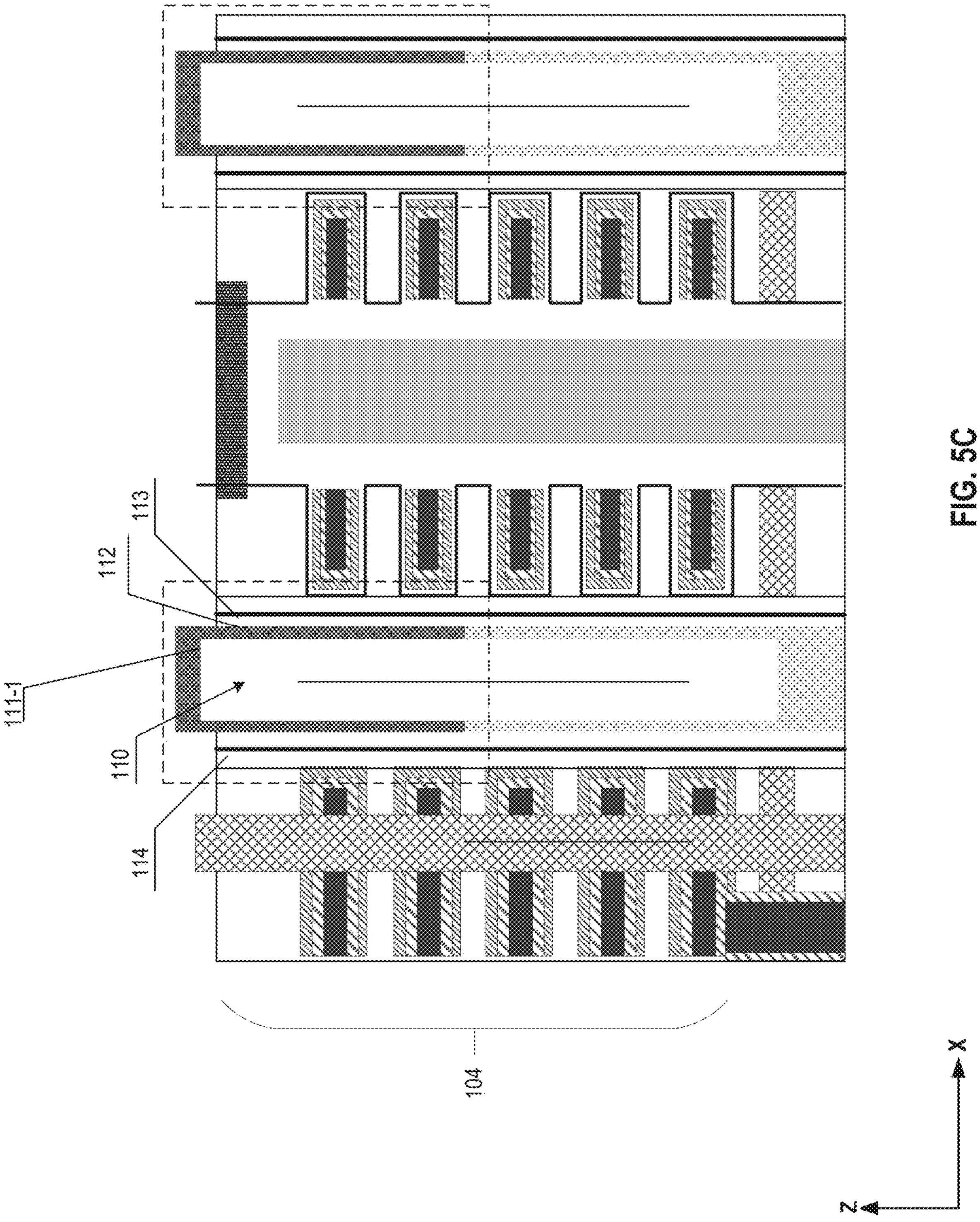
Figure 5D:
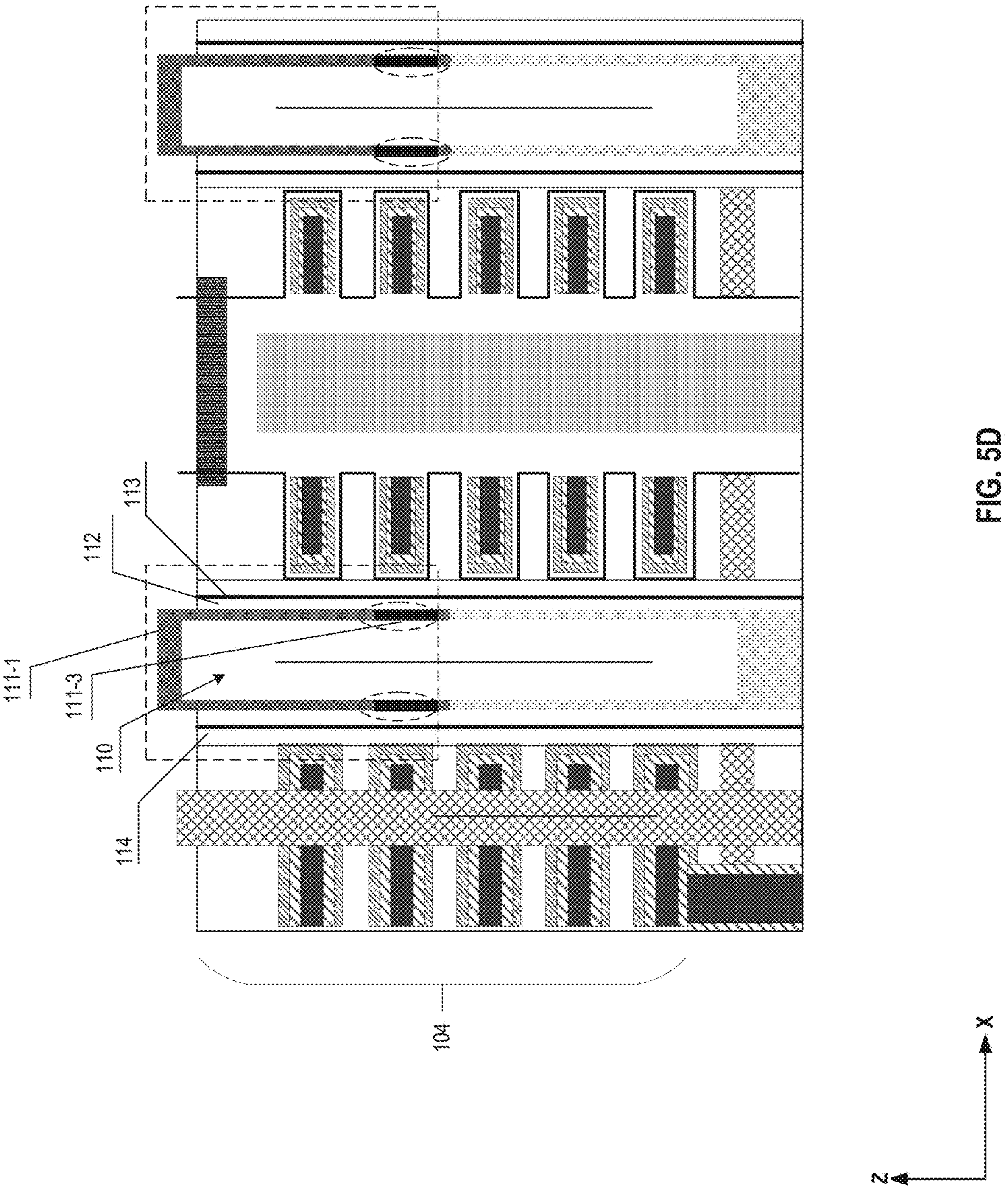
Figure 5F:
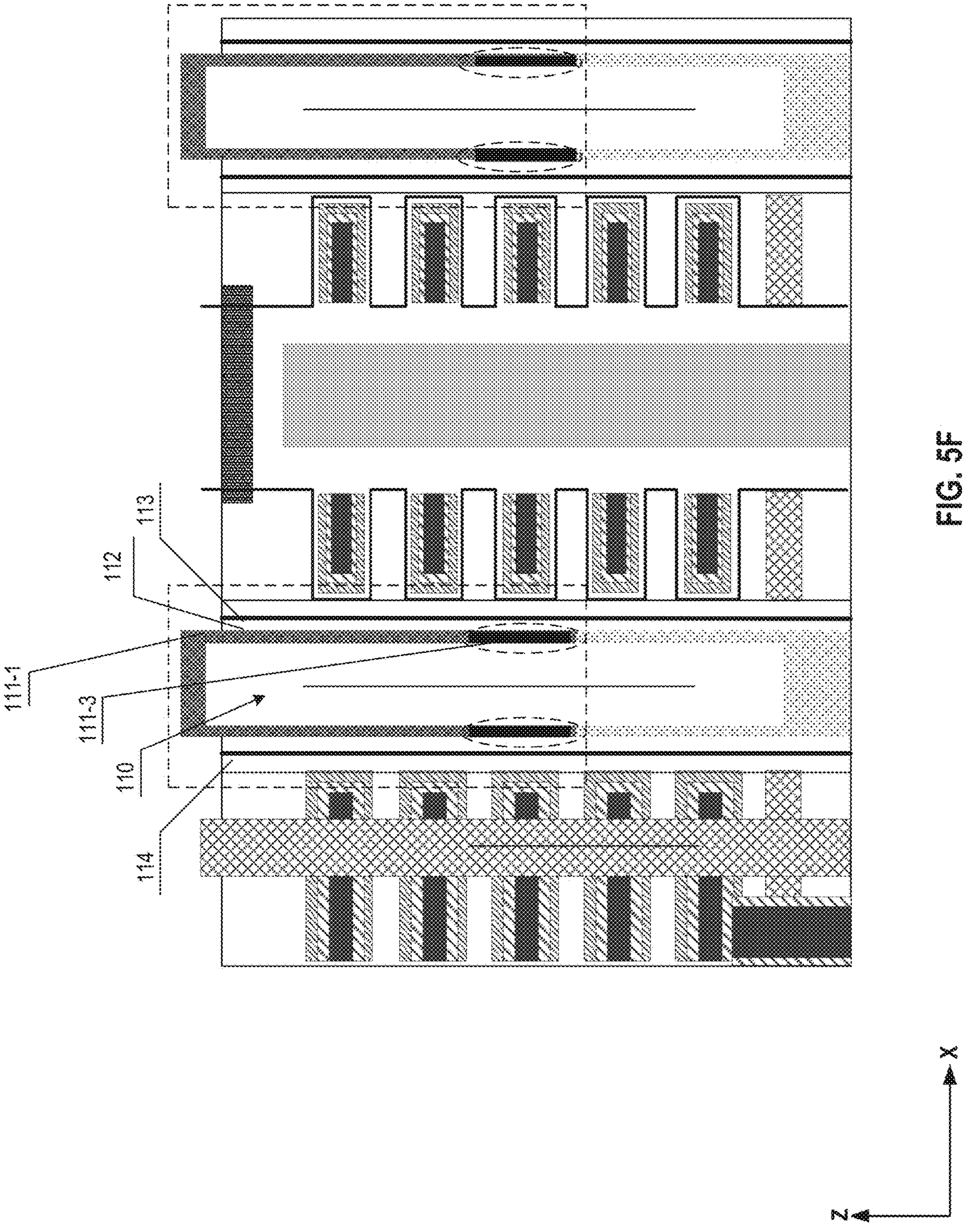

In some implementations, as shown by the dotted boxes in FIGS. 5A to 5F, channel layer 111 is doped by an ion implantation process, and the ion implantation energy is controlled to make the ion implantation depths different; that is, the doping depths are different. As shown in FIG. 5A, doped channel layer 111-1 in stack structure 104 extends in the z-direction and to a depth of the uppermost gate layer. It is noted that the uppermost gate layer herein is an uppermost layer of the interleaved stack conductive layers of stack structure 104. As shown in FIG. 5B, beyond doped channel layer 111-1, a heavily doped channel layer 111-3 can also be formed in the depth of the uppermost gate layer. It is noted that a doping concentration of heavily doped channel layer 111-3 is higher than that of doped channel layer 111-1. As such, the GIDL effect can be enhanced. Also, as shown in FIG. 5C, doped channel layer 111-1 in stack structure 104 extends in the z-direction and to a depth of two gate layers. As shown in FIG. 5D, beyond doped channel layer 111-1, heavily doped channel layer 111-3 can also be formed in the depth of second uppermost gate layer. Also, as shown in FIG. 5E, doped channel layer 111-1 in stack structure 104 extends in the z-direction and to a depth of three gate layers. As shown in FIG. 5F, beyond doped channel layer 111-1, heavily doped channel layer 111-3 can also be formed in the depth of third uppermost gate layer. By controlling the location of heavily doped channel layer 111-3 to correspond to the location (e.g., a same or similar lateral level) of the specific gate layer, it can enhance the GIDL effect of specific or all the memory cells.

Figure 3:
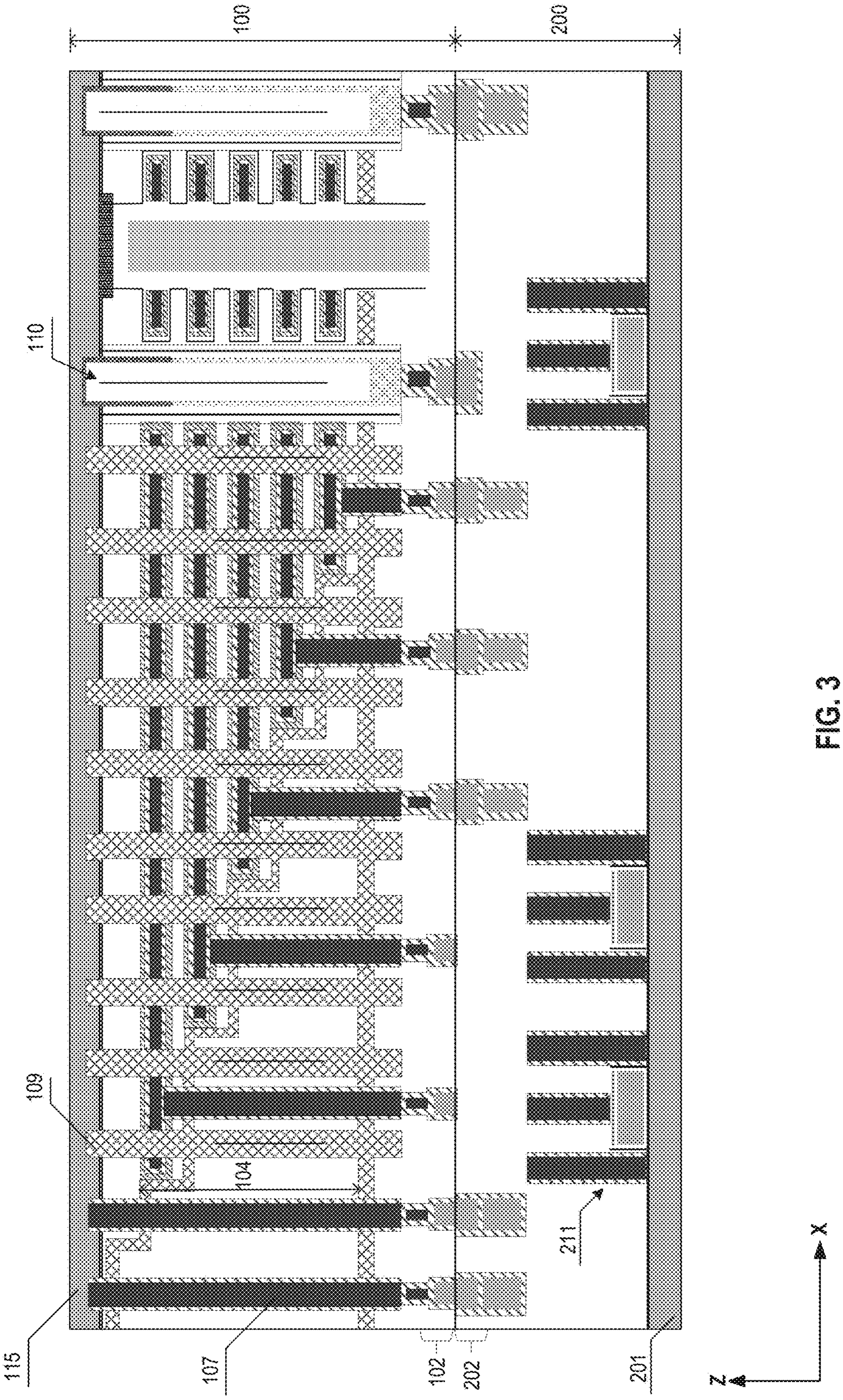

Method 1500 proceeds to operation 1504, as illustrated in FIG. 15, in which a doped semiconductor layer covering the end of the channel layer and the stack structure is formed. As illustrated in FIG. 3, a doped semiconductor layer 115 covering the end of channel structure 110 and stack structure 104 is formed. In some implementations, doped semiconductor layer 115 may be an N-type doped semiconductor layer. Specifically, the N-type doped semiconductor layer may include, for example, polysilicon, single crystal silicon, or amorphous silicon. In some implementations, one or more thin film deposition processes including, but not limited to, CVD, PVD, ALD, or any combination thereof, may be used to form polysilicon overlying the end of channel structure 110 and stack structure 104. The polysilicon is then doped with N-type dopants using an ion implantation process, and doped semiconductor layer 115 is formed thereafter. In some implementations, an in-situ growth process may be used to form the doped semiconductor layer. Specifically, doped channel layer 111-1 is partially located in doped semiconductor layer 115, and partially located in stack structure 104. In some implementations, the doping concentration of doped semiconductor layer 115 can be between $1\times10^{13}$ $cm^{-3}$ and $1\times10^{23}$ $cm^{-3}$ (e.g., $1\times10^{13}$, $1\times10^{14}$, $1\times10^{15}$, $1\times10^{16}$, $1\times10^{17}$, $1\times10^{18}$, $1\times10^{19}$, $1\times10^{20}$, $1\times10^{21}$, $1\times10^{22}$, $1\times10^{23}$, or any range bounded by the lower end by any of these values, or in any range defined by any two of these values).

In some implementations, doped channel layer 111-1 (e.g., including heavily doped channel layer 111-3) and doped semiconductor layer 115 are activated, so that doped channel layer 111-1 and doped semiconductor layer 115 have the same doping concentration. That is, after the activation treatment, doped channel layer 111-1 and doped semiconductor layer 115 may have the same doping concentration. By doing so, when an erasing operation is performed, an electron current path is formed between the N-type doped semiconductor layer (e.g., 115) and the doped channel layer (e.g., 111-1), and electrons are supplied to the memory strings. Under the condition that the doping concentration of the doped channel layer and the doped semiconductor layer is the same or at least at the same magnitude (e.g., the difference between two doping concentrations is less than an order), the same GIDL voltage can be applied to different memory cells on the memory string, so that the GIDL current with substantially the same magnitude can be realized. This can increase erase speed, reduce current consumption, and/or reduce power consumption.

The activation treatment may include a thermal activation treatment or a laser activation treatment. It should be noted that the temperature of laser activation treatment is lower than that of thermal activation treatment. In practical applications, the activation treatment process can be selected according to actual needs so as to avoid the influence of the activation treatment temperature on the subsequent process.

Figure 4:
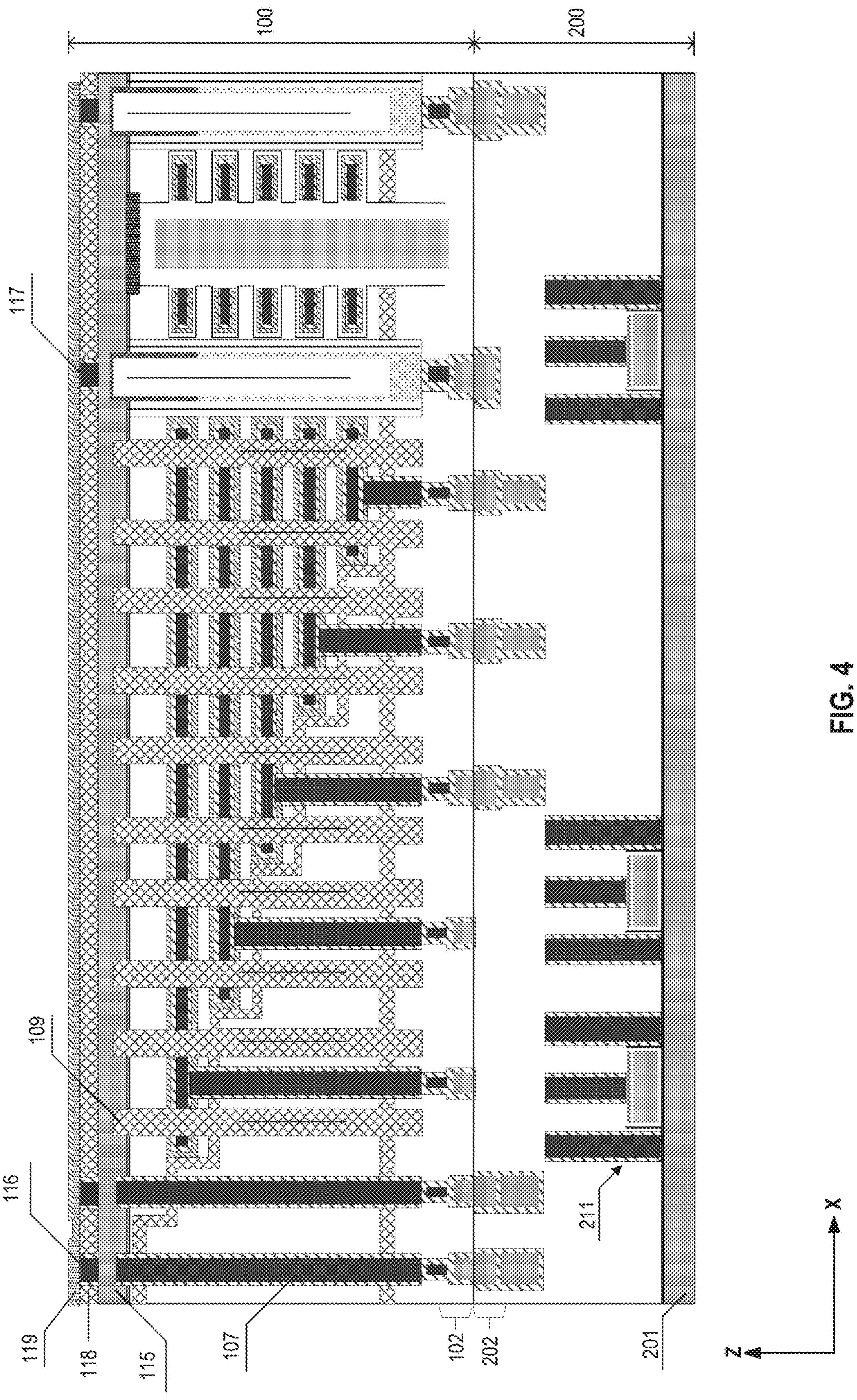

After forming the doped semiconductor layer, as shown in FIG. 4, a through silicon contact (TSC) opening and a source contact opening can be formed on the doped semiconductor layer. And then, the TSC opening and the source contact opening are filled with conductive material to form TSC 116 and source contact 117. TSC 116 can be in contact with one end of peripheral contact 107. As shown in FIG. 4, a dielectric material layer 118 is formed on doped semiconductor layer 115, and then the TSC openings and the source contact openings are formed through dielectric material layer 118 into doped semiconductor layer 115. In some implementations, the source contact opening may extend further into an upper portion of doped semiconductor layer 115. That is, the upper portion of doped semiconductor layer 115 may continue to be etched after etching through dielectric material layer 118. In some implementations, the source contact openings are formed using a wet etch/dry etch process. In some implementations, different etching processes may be used for etching through dielectric material layer 118 and etching doped semiconductor layer 115.

Still referring to FIG. 4, on the backside of doped semiconductor layer 115, the source contact openings are filled with conductive material to form source contacts 117. In particular, one or more conductive materials may be deposited into the source contact openings using one or more thin film deposition processes such as CVD, PVD, ALD, any other suitable process, or a combination thereof, to utilize adhesive compound and conductive layer to fill the source contact openings. Then, a planarization process, e.g., a CMP process, may be performed to remove excess conductive material such that the upper surface of the source contact is flush with the top surface of dielectric material layer 118. In some implementations, source contact 117 is electrically connected to channel structure 110 through doped semiconductor layer 115. Source contact 117 may or may not be directly above channel structure 110, as long as source contact 117 can be electrically connected to channel structure 110 through doped semiconductor layer 115. A third interconnection layer 119 is formed above source contact 117. Third interconnection layer 119 may be electrically connected to source contact 117 via the source contact openings and also connected to peripheral contact 107 via the TSC openings to realize the fan-out pad. For example, electrical signals can be communicated between first semiconductor structure 100 and second semiconductor structure 200 from third interconnection layer 119 to transistors 211 via peripheral contact 107, first bonding layer 102, and second bonding layer 202. In some implementations, photolithography is used to pattern the TSC openings in alignment with peripheral contacts 107, and to pattern the source contact openings in alignment with channel structure 110. Etching of the TSC openings may stop at the upper end of peripheral contacts 107, and etching of the source contact openings may stop at the upper end of channel structure 110.

FIGS. 6-9 illustrate a fabrication process for forming an exemplary 3D memory device, according to some aspects of the present disclosure. FIGS. 6-9 may use a similar fabrication process but with a different process of removing the first substrate and the sacrificial layer in which the first substrate and the sacrificial layer are removed by a polishing (e.g., CMP) process to expose one end of the channel layer. Specifically, since the CMP process does not have selectivity in comparison to the wet etch process, a portion of the channel layers and an end of the dummy channel layer may be removed at the same time as the first substrate and the sacrificial layer are removed. That is, after the CMP process, the top surface of the memory device may be a flattened surface.

Figure 6:
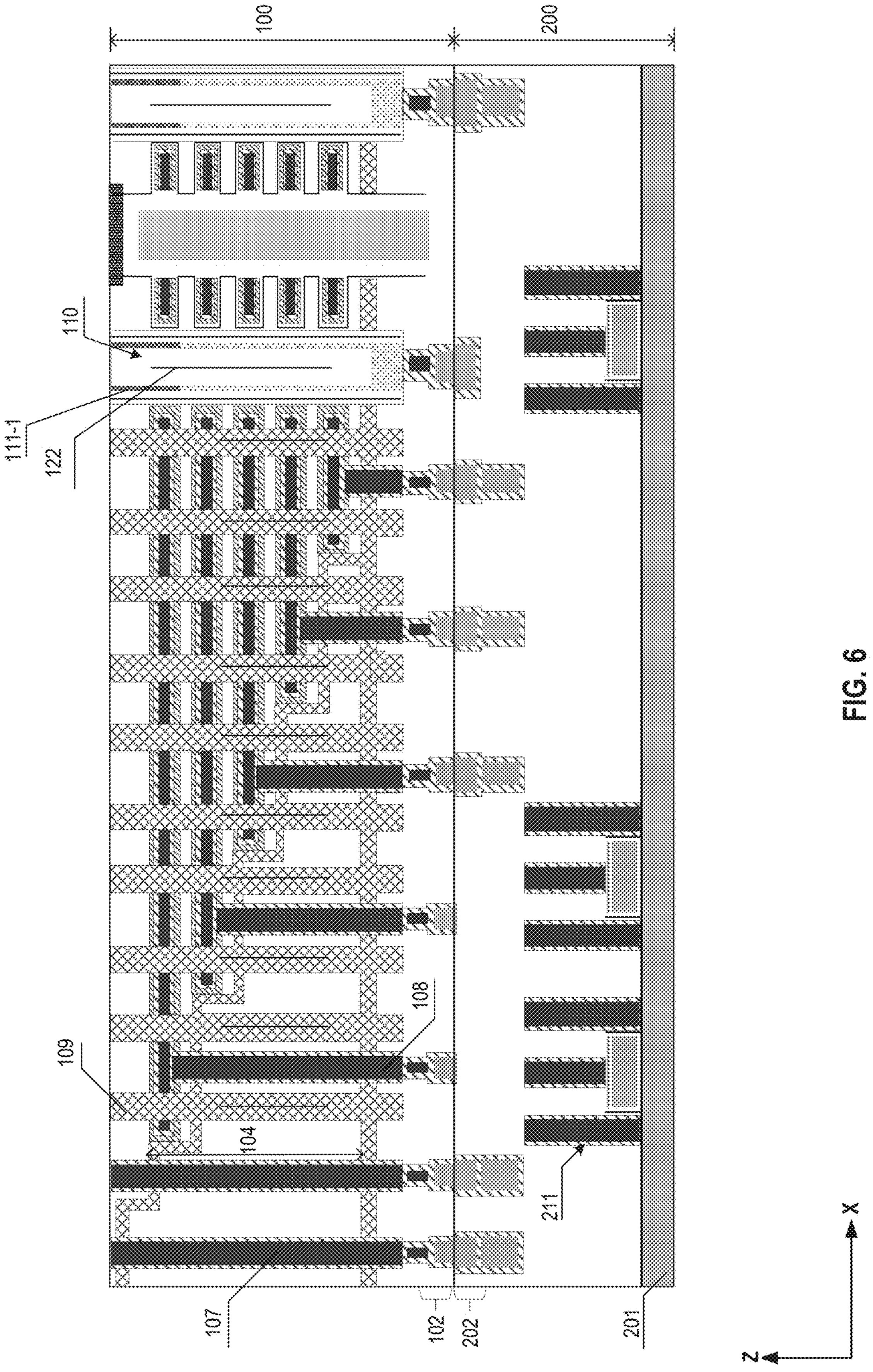
FIGS. 6-8 illustrate a fabrication process for forming an exemplary 3D memory device, according to some aspects of the present disclosure.

As shown in FIG. 6, the channel layer of channel structure 110 in the channel hole is doped to form a doped channel layer 111-1, and at this time, doped channel layer 111-1 is all located in stack structure 104. In some implementations, doped channel layer 111-1 may be doped using an ion implantation process. Also, a first air gap 122 in the middle position of channel structure 110 is formed and extending in the vertical direction (e.g., z-direction). The process of doping the channel layer will not affect first air gap 122 in the channel hole. Moreover, in the subsequent process of forming the doped semiconductor layer through the in-situ growth process, the air gap in the channel hole will not be affected. Here, first air gap 122 is a closed cavity formed by being surrounded by the filler in the channel hole.

Figure 9A:
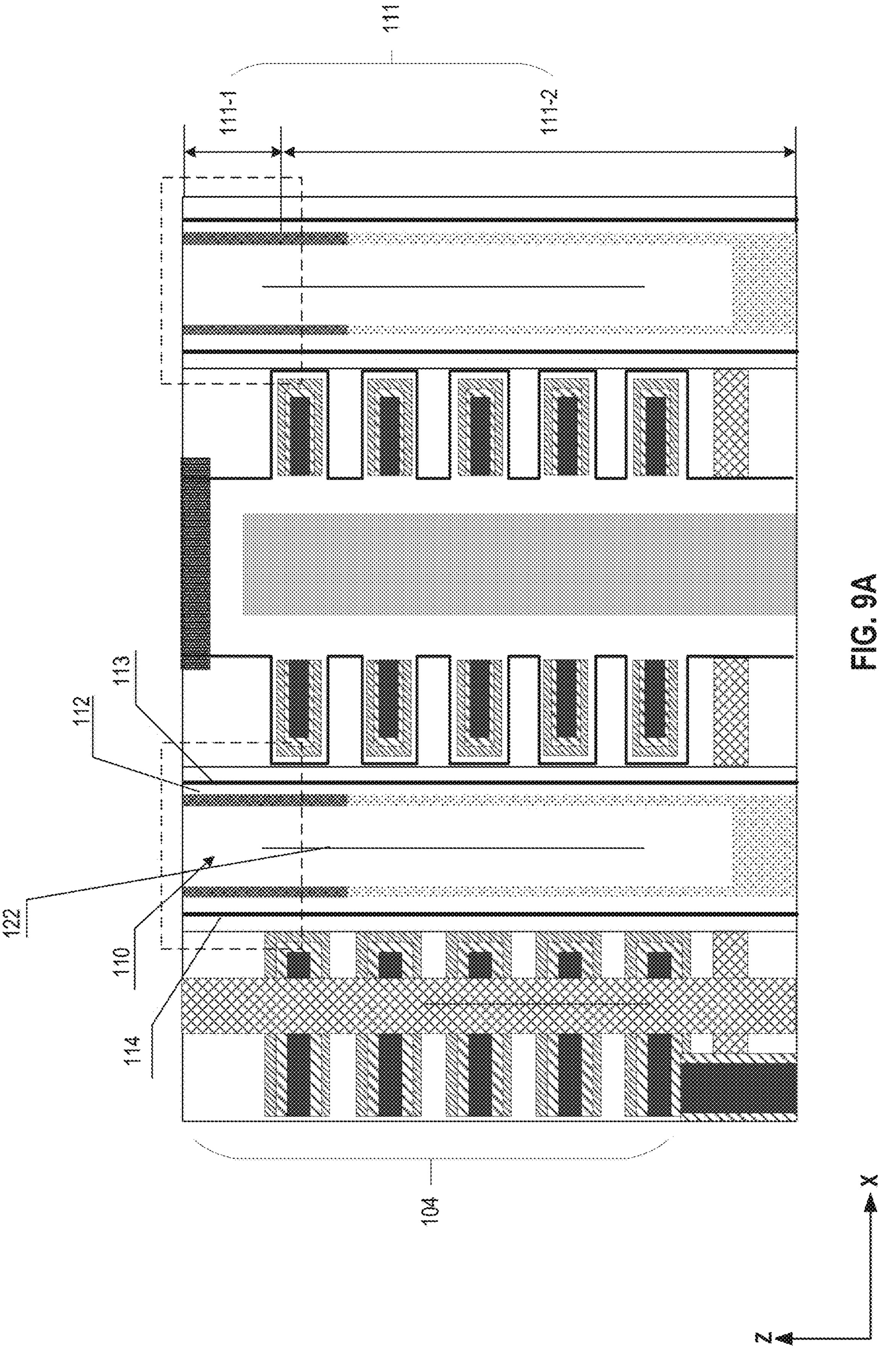
FIGS. 9A-9F illustrate a fabrication process for forming an exemplary 3D memory device, according to some aspects of the present disclosure.

FIG. 9A further shows a partially enlarged view for illustrating the doping profile of channel layer 111 after being doped in FIG. 6. As shown in FIG. 9A, channel layer 111 may include a doped channel layer 111-1 and an undoped channel layer 111-2. Undoped channel layer 111-2 may be located below doped channel layer 111-1. Doped channel layer 111-1 may extend vertically into stack structure and thus locate in stack structure 104. It is noted that, by using the ion implantation to dope the channel layer, a doping depth may be an ion implantation depth. As such, the ion implantation depth can be adjusted to control the doping depth of the doped channel layer 111-1 accordingly. It is also noted that the doping depth of the doping channel layer is not limited to the present disclosure, different doping depths, doping concentrations, or doping profiles can be set according to the actual requirements of the memory device. Among them, the doping depth can be controlled by adjusting the acceleration energy of the ion beam. The doping concentration, that is, the impurity dose, can be controlled by monitoring the ion current during implantation. The doping impurity distribution can be adjusted by simultaneously adjusting the ion implantation energy and ion implantation dose to control. Therefore, by using the ion implantation process for doping, the doping concentration, doping depth, and doping impurity distribution can be controlled more accurately with repeatability. In some implementations, the doping concentration of doped channel layer 111-1 can be between $1\times10^{13}$ $cm^{-3}$ and $1\times10^{23}$ $cm^{-3}$ (e.g., $1\times10^{13}$, $1\times10^{14}$, $1\times10^{15}$, $1\times10^{16}$, $1\times10^{17}$, $1\times10^{18}$, $1\times10^{19}$, $1\times10^{20}$, $1\times10^{21}$, $1\times10^{22}$, $1\times10^{23}$, or any range bounded by the lower end by any of these values, or in any range defined by any two of these values). In some implementations, the depth of doped channel layer 111-1 can be between 0 nm and 500 nm (e.g., 50 nm, 100 nm, 150 nm, 200 nm, 250 nm, 300 nm, 350 nm, 400 nm, 450 nm, 500 nm, or any range bounded by the lower end by any of these values, or in any range defined by any two of these values).

In some implementations, doped channel layer 111-1 may be an N-type doped channel layer. Specifically, the N-type doped channel layer may include, for example, polysilicon, single crystal silicon, or amorphous silicon. The N-type doped channel layer may include a pentavalent impurity element such as phosphorus (P), arsenic (As), or antimony (Tb) as an N-type dopant. Since only four valence electrons in the pentavalent impurity atom can form covalent bonds with the valence electrons in the surrounding four semiconductor atoms, the extra valence electron can easily form a free electron because it is not bound by covalent bonds. Therefore, the N-type doped channel layer can provide free electrons. In some implementations, an ion implantation process is employed to dope the upper end of the channel layer with any suitable N-type dopant to a desired doping depth and doping concentration.

Figure 9B:
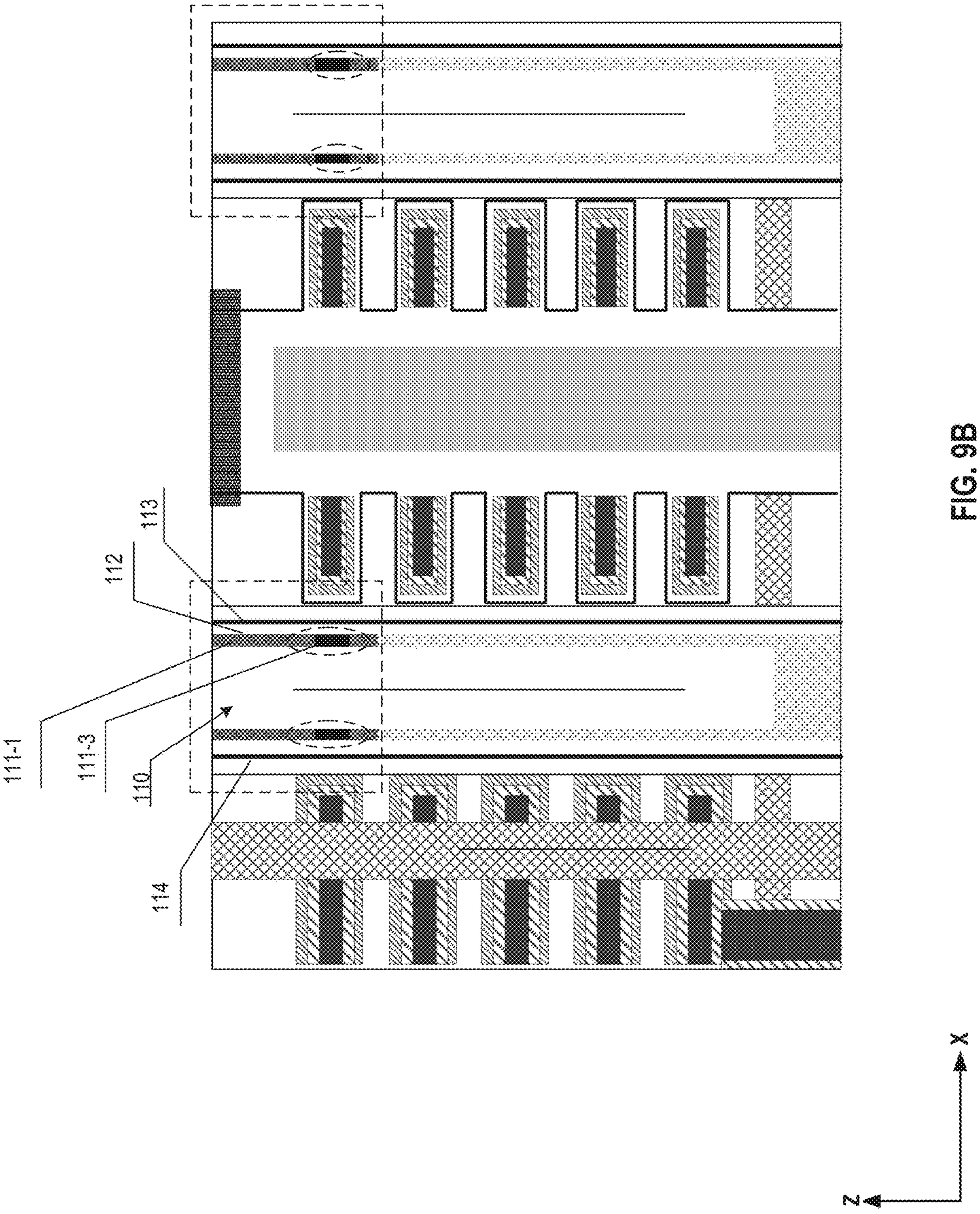
Figure 9C:
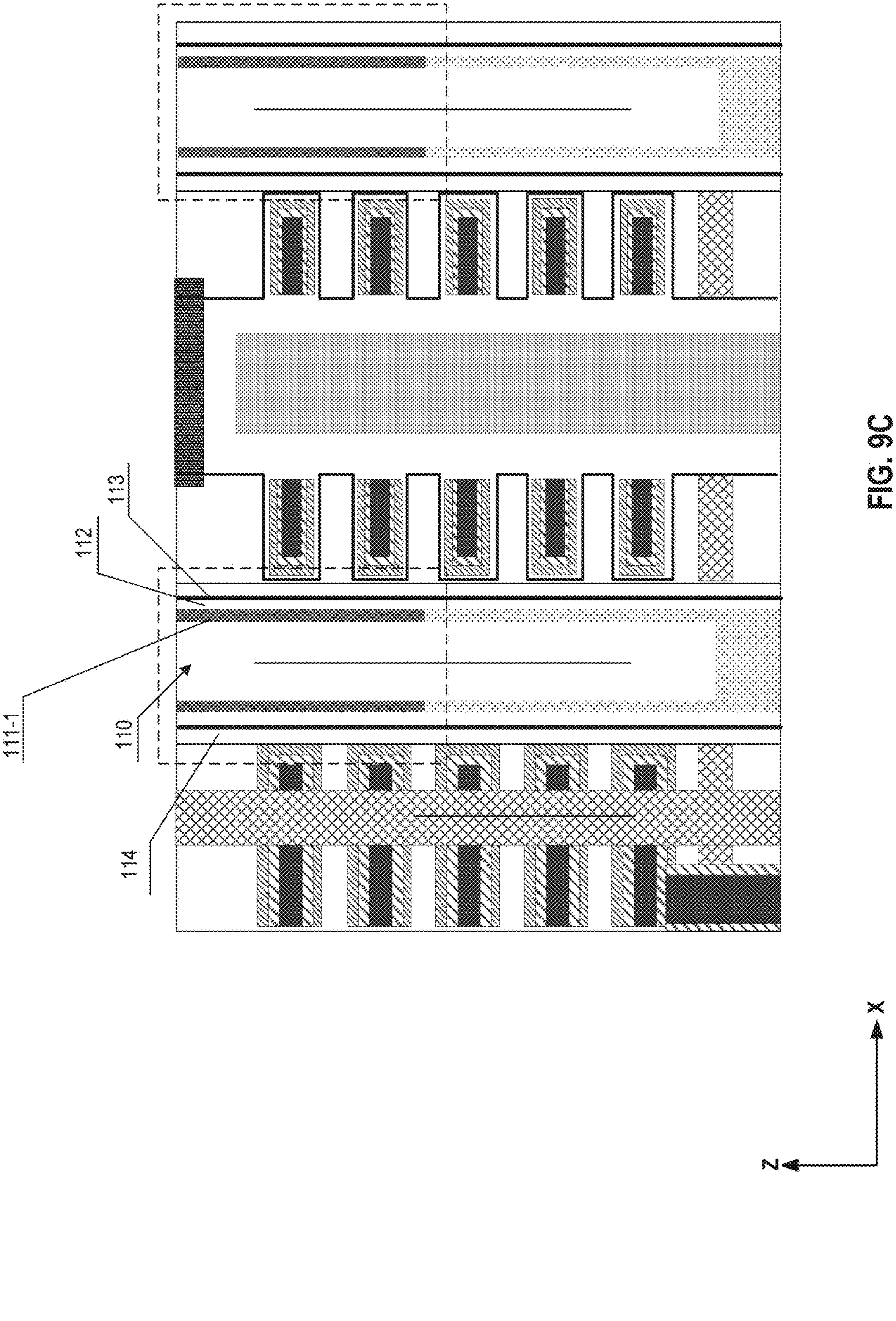
Figure 9D:
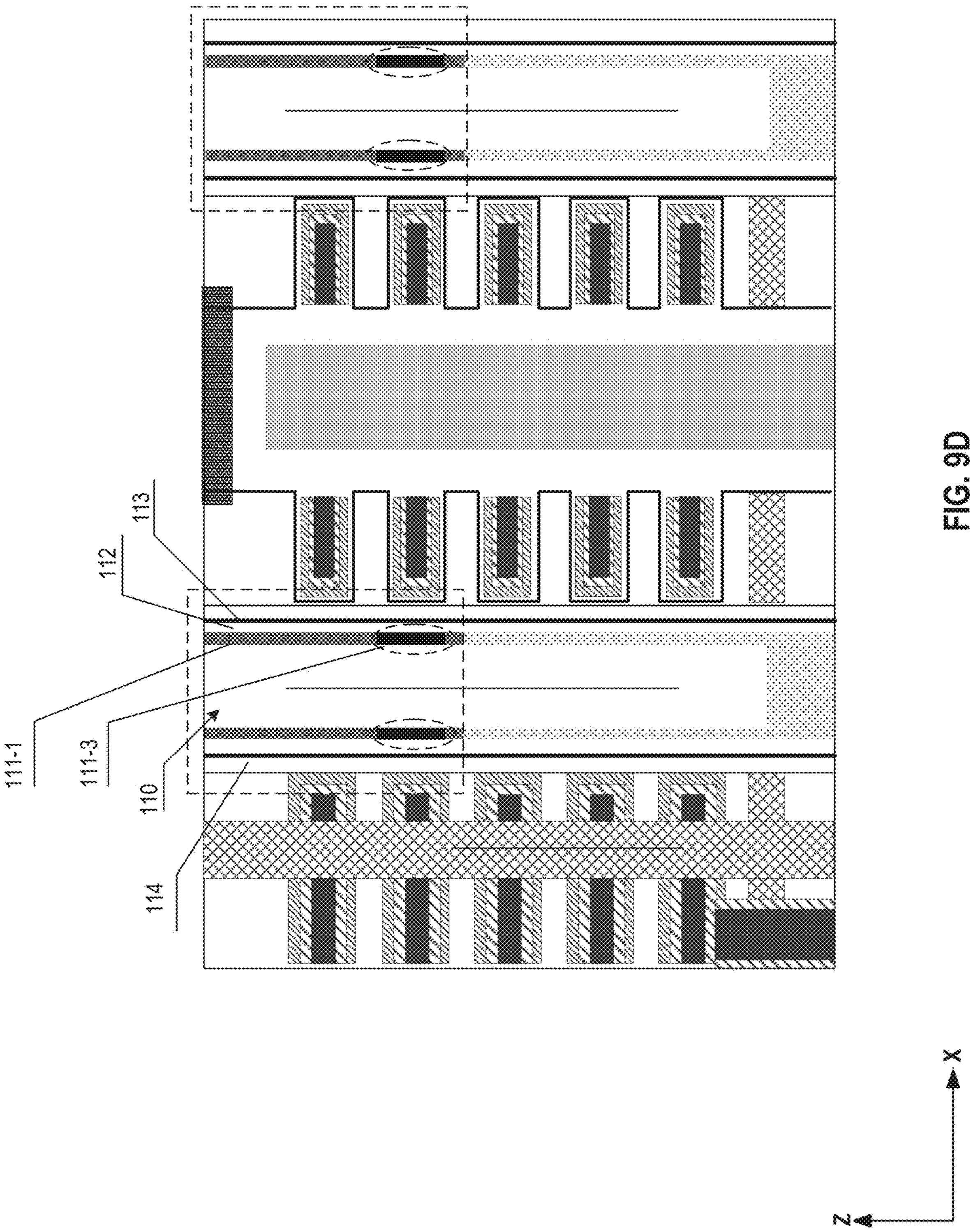
Figure 9E:
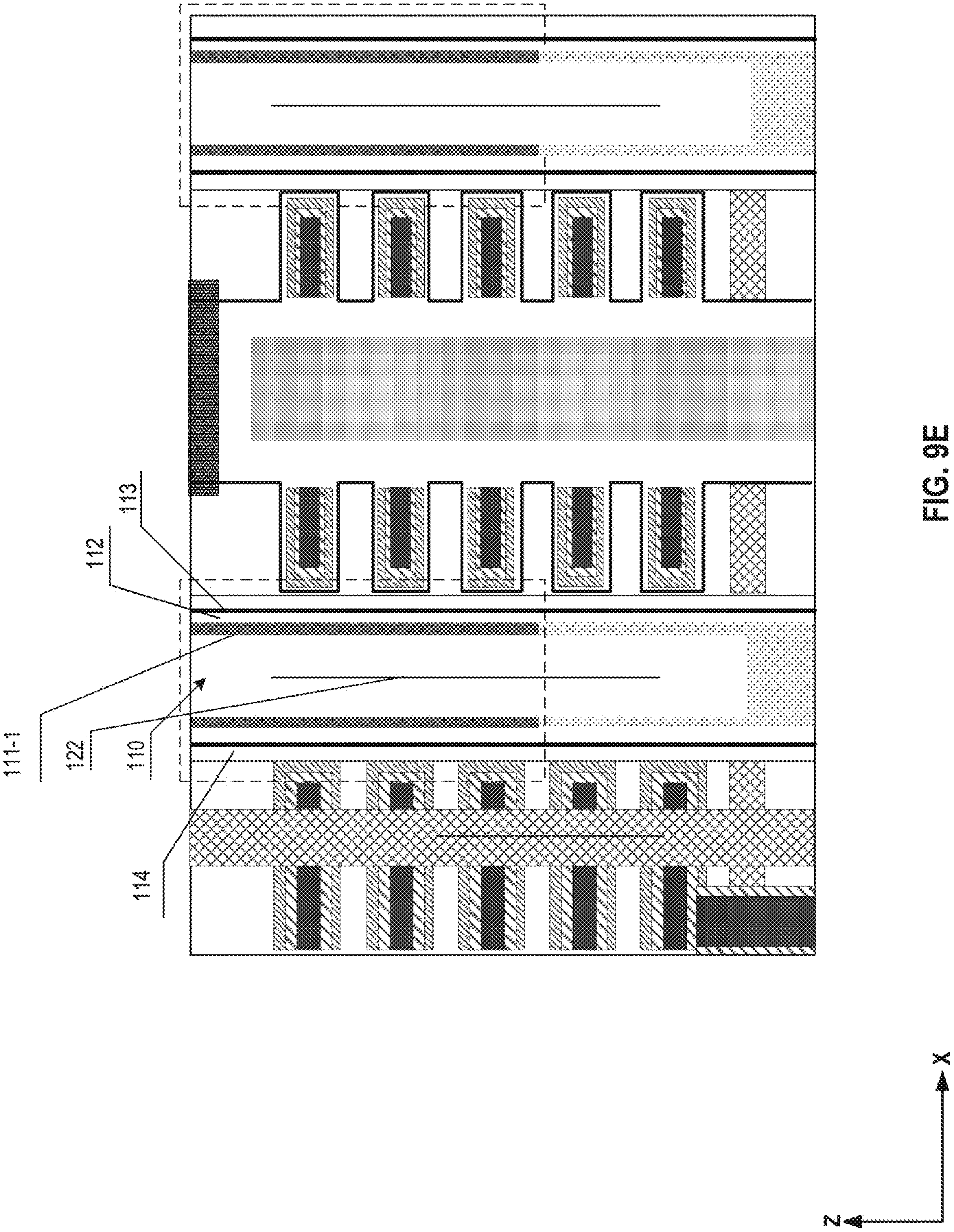
Figure 9F:
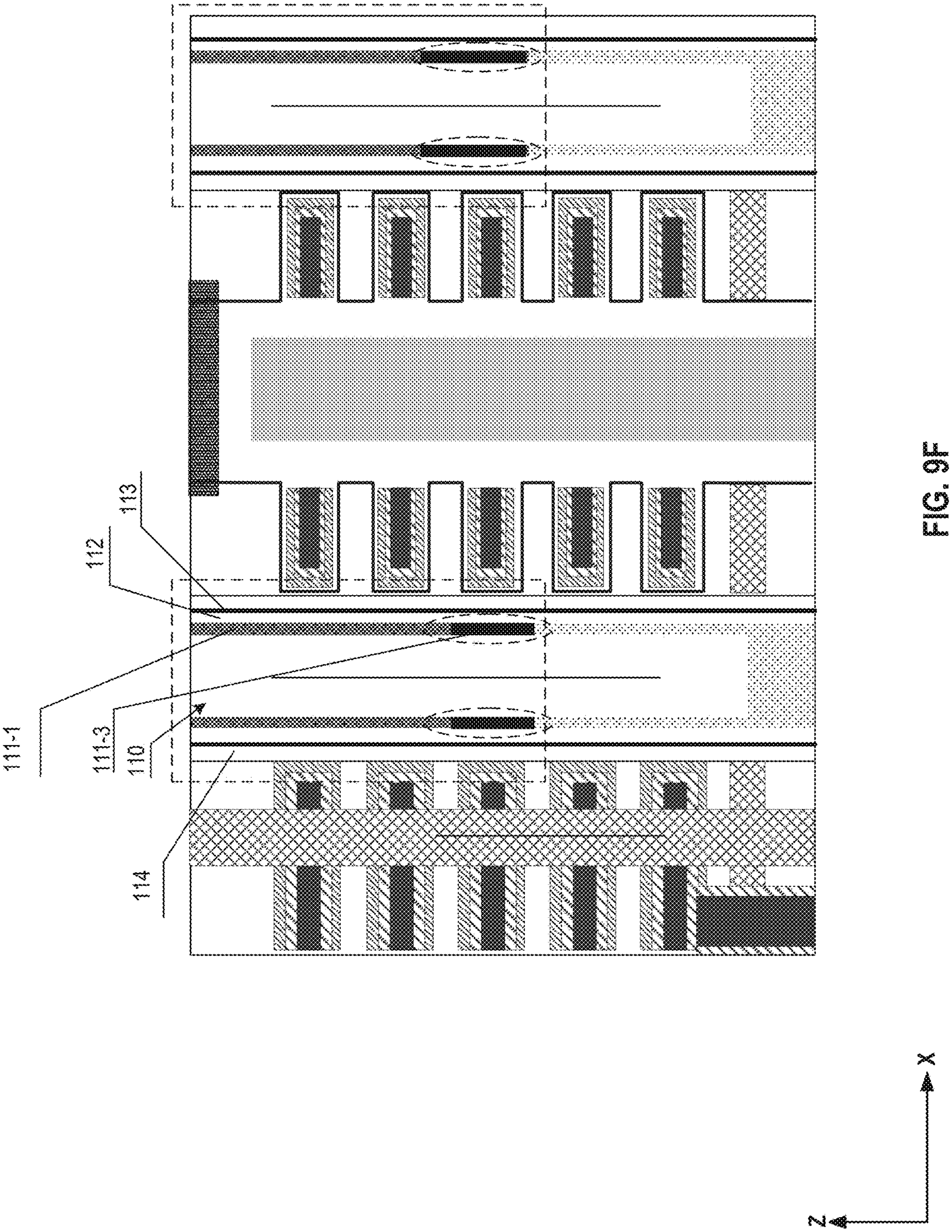

In some implementations, as shown by the dotted boxes in FIGS. 9A to 9F, channel layer 111 is doped by an ion implantation process, and the ion implantation energy is controlled to make the ion implantation depths different; that is, the doping depths are different. As shown in FIG. 9A, doped channel layer 111-1 in stack structure 104 extends in the z-direction and to a depth of the uppermost gate layer. As shown in FIG. 9B, beyond doped channel layer 111-1, a heavily doped channel layer 111-3 can also be formed in the depth of the uppermost gate layer. It is noted that a doping concentration of heavily doped channel layer 111-3 is higher than that of doped channel layer 111-1. As such, the GIDL effect can be enhanced. Also, as shown in FIG. 9C, doped channel layer 111-1 in stack structure 104 extends in the z-direction and to a depth of two consecutively arranged gate layers. As shown in FIG. 9D, beyond doped channel layer 111-1, heavily doped channel layer 111-3 can also be formed in the depth of the second uppermost gate layer. Also, as shown in FIG. 9E, doped channel layer 111-1 in stack structure 104 extends in the z-direction and to a depth of three consecutively arranged gate layers. As shown in FIG. 9F, beyond doped channel layer 111-1, heavily doped channel layer 111-3 can also be formed in the depth of third uppermost gate layer. By controlling the location of heavily doped channel layer 111-3 to correspond to the location of the specific gate layer, it can enhance the GIDL effect of specific or all the memory cells.

Figure 7:
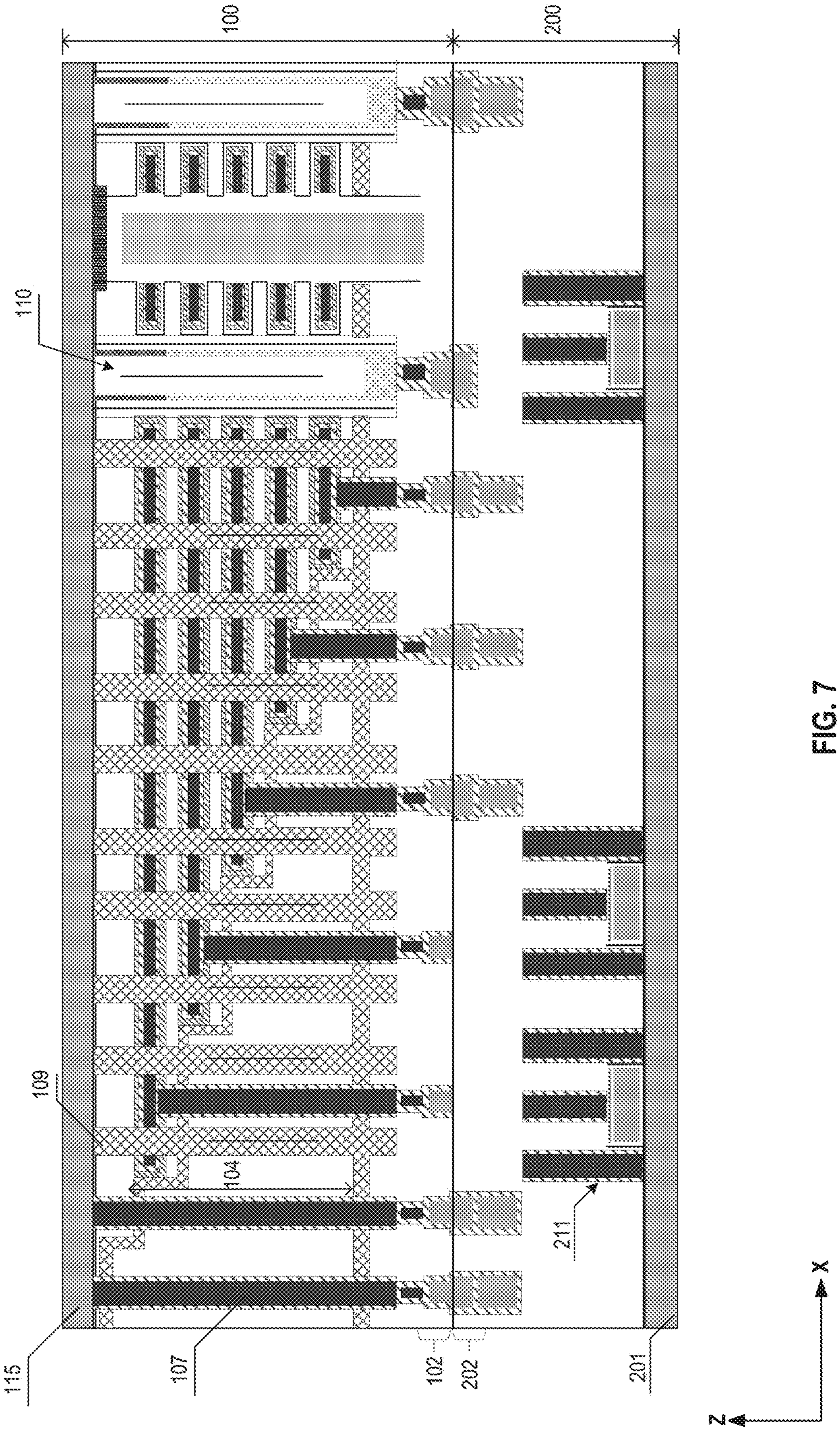

As illustrated in FIG. 7, a doped semiconductor layer 115 covering the end of channel structure 110 and stack structure 104 is formed. In some implementations, doped semiconductor layer 115 may be an N-type doped semiconductor layer. Specifically, the N-type doped semiconductor layer may include, for example, polysilicon, single crystal silicon, or amorphous silicon. In some implementations, one or more thin film deposition processes including, but not limited to, CVD, PVD, ALD, or any combination thereof, may be used to form polysilicon overlying the end of channel structure 110 and stack structure 104. The polysilicon is then doped with N-type dopants using an ion implantation process, and doped semiconductor layer 115 is formed thereafter. In some implementations, an in-situ growth process may be used to form the doped semiconductor layer. Specifically, doped channel layer 111-1 is not partially located in doped semiconductor layer 115 in the present embodiment but is only located in stack structure 104. In some implementations, the doping concentration of doped semiconductor layer 115 can be between $1\times10^{13}$ $cm^{-3}$ and $1\times10^{23}$ $cm^{-3}$ (e.g., $1\times10^{13}$, $1\times10^{14}$, $1\times10^{15}$, $1\times10^{16}$, $1\times10^{17}$, $1\times10^{18}$, $1\times10^{19}$, $1\times10^{20}$, $1\times10^{21}$, $1\times10^{22}$, $1\times10^{23}$, or any range bounded by the lower end by any of these values, or in any range defined by any two of these values).

In some implementations, doped channel layer 111-1 (e.g., including heavily doped channel layer 111-3 as in FIGS. 9B, 9D, and 9F) and doped semiconductor layer 115 are activated, so that doped channel layer 111-1 and doped semiconductor layer 115 have the same doping concentration. That is, after the activation treatment, doped channel layer 111-1 and doped semiconductor layer 115 may have the same doping concentration. By doing so, when an erasing operation is performed, an electron current path is formed between the N-type doped semiconductor layer (e.g., 115) and the doped channel layer (e.g., 111-1), and electrons are supplied to the memory strings. Under the condition that the doping concentration of the doped channel layer and the doped semiconductor layer is the same or at least at the same magnitude (e.g., the difference between two doping concentrations is less than an order), the same GIDL voltage can be applied to different memory cells on the memory string, so that the GIDL current with substantially the same magnitude can be realized. This can increase erase speed, reduce current consumption, and/or reduce power consumption.

The activation treatment may include a thermal activation treatment or a laser activation treatment. It should be noted that the temperature of laser activation treatment is lower than that of thermal activation treatment. In practical applications, the activation treatment process can be selected according to actual needs so as to avoid the influence of the activation treatment temperature on the subsequent process.

Figure 8:
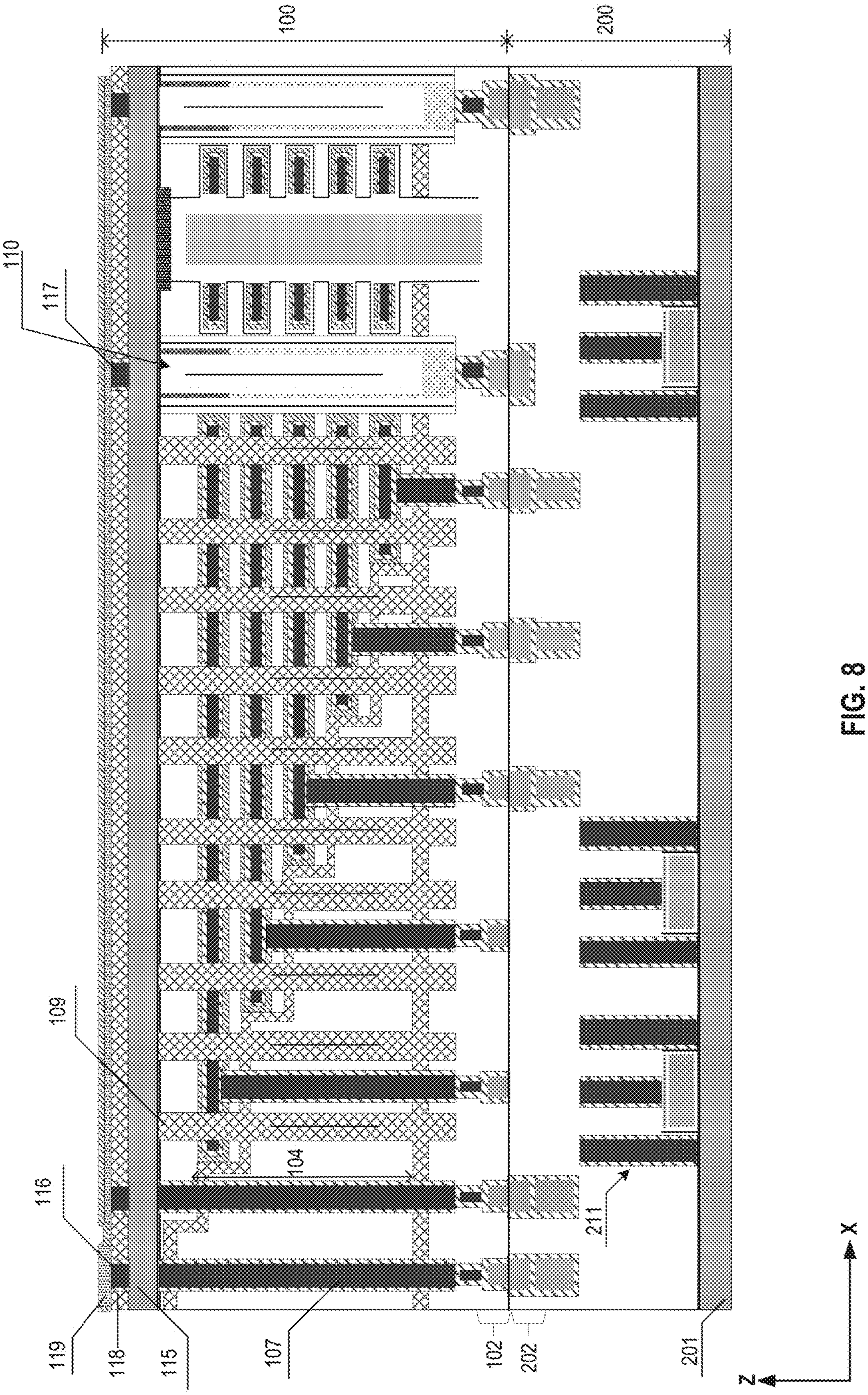

After forming the doped semiconductor layer, as shown in FIG. 8, a TSC opening and a source contact opening can be formed on the doped semiconductor layer. And then, the TSC opening and the source contact opening are filled with conductive material to form TSC 116 and source contact 117. TSC 116 can be in contact with one end of peripheral contact 107. As shown in FIG. 8, a dielectric material layer 118 is formed on doped semiconductor layer 115, and then the TSC openings and the source contact openings are formed through dielectric material layer 118 into doped semiconductor layer 115. In some implementations, the source contact opening may extend further into an upper portion of doped semiconductor layer 115. That is, the upper portion of doped semiconductor layer 115 may continue to be etched after the etch process has passed through dielectric material layer 118. In some implementations, the source contact openings are formed using a wet etch/dry etch process. In some implementations, different etching processes may be used for etching through dielectric material layer 118 and etching doped semiconductor layer 115.

Still referring to FIG. 8, on the backside of doped semiconductor layer 115, the source contact openings are filled with conductive material to form source contacts 117. In particular, one or more conductive materials may be deposited into the source contact openings using one or more thin film deposition processes such as CVD, PVD, ALD, any other suitable process, or a combination thereof, to utilize adhesive compound and conductive layer to fill the source contact openings. Then, a planarization process, e.g., a CMP process, may be performed to remove excess conductive material such that the upper surface of the source contact is flush with the top surface of dielectric material layer 118. In some implementations, source contact 117 is electrically connected to channel structure 110 through doped semiconductor layer 115. Source contact 117 may or may not be directly above channel structure 110, as long as source contact 117 can be electrically connected to channel structure 110 through doped semiconductor layer 115. A third interconnection layer 119 may be formed above source contact 117. Third interconnection layer 119 may be electrically connected to source contact 117 via the source contact openings and connected to peripheral contact 107 via the TSC openings to realize the fan-out pad. For example, electrical signals can be communicated between first semiconductor structure 100 and second semiconductor structure 200 from third interconnection layer 119 to transistors 211 via peripheral contact 107, first bonding layer 102, and second bonding layer 202. In some implementations, photolithography is used to pattern the TSC openings in alignment with peripheral contacts 107, and to pattern the source contact openings in alignment with channel structure 110. Etching of the TSC openings may stop at the upper end of peripheral contacts 107, and etching of the source contact openings may stop at the upper end of channel structure 110.

Figure 10:
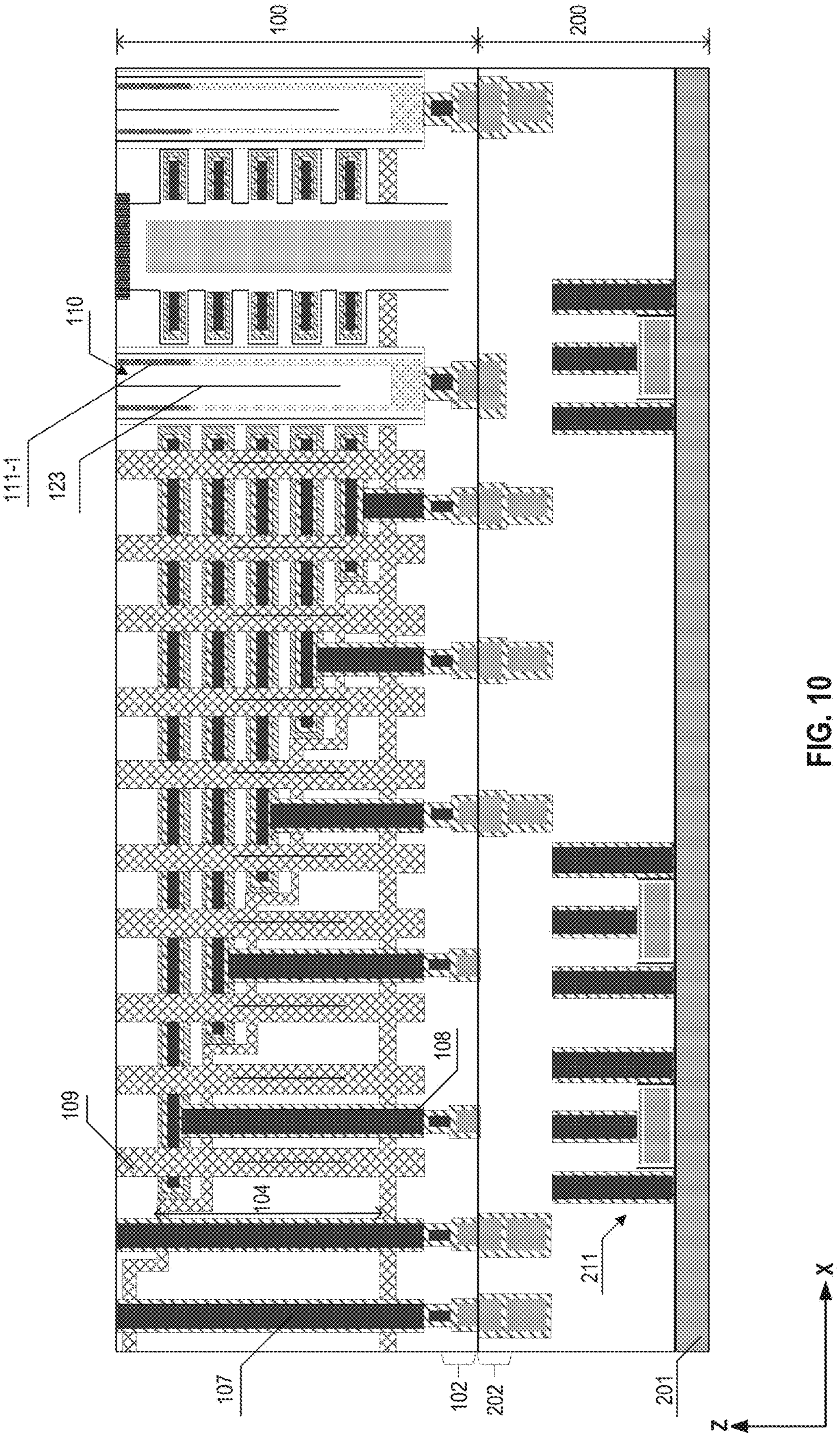
FIGS. 10-12 illustrate a fabrication process for forming an exemplary 3D memory device, according to some aspects of the present disclosure.
Figure 11:
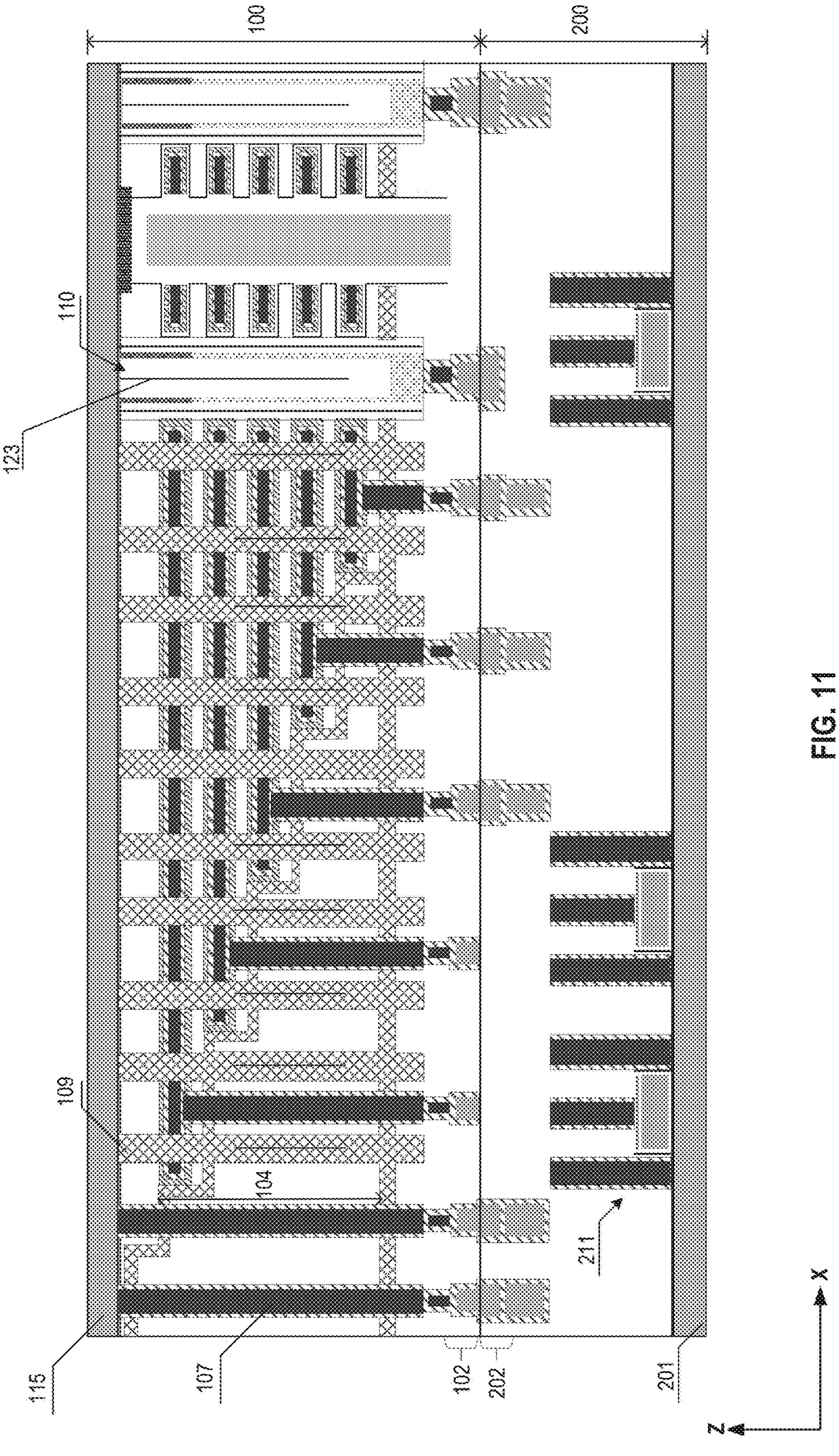
Figure 12:
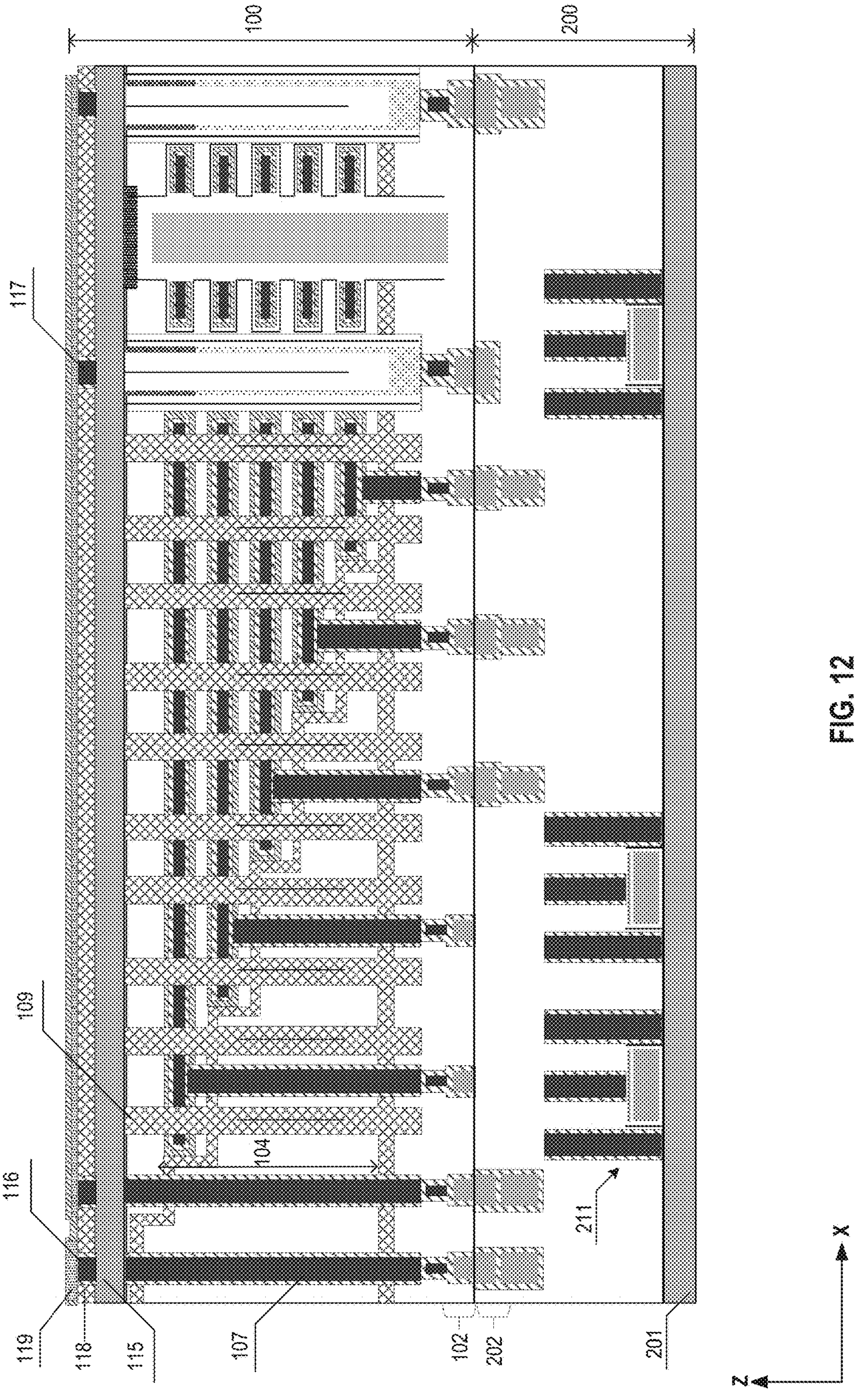

FIGS. 10-12 illustrate a fabrication process for forming an exemplary 3D memory device, according to some aspects of the present disclosure. FIGS. 10-12 may use a similar fabrication process as in FIGS. 6-8. The only difference is that, during the CMP process, the end of the channel layer has an opening of a second air gap 123. In the subsequent formation process of doped semiconductor layer 115, doped semiconductor layer 115 may be partially formed and filled in the opening of second air gap 123.

Figure 13A:
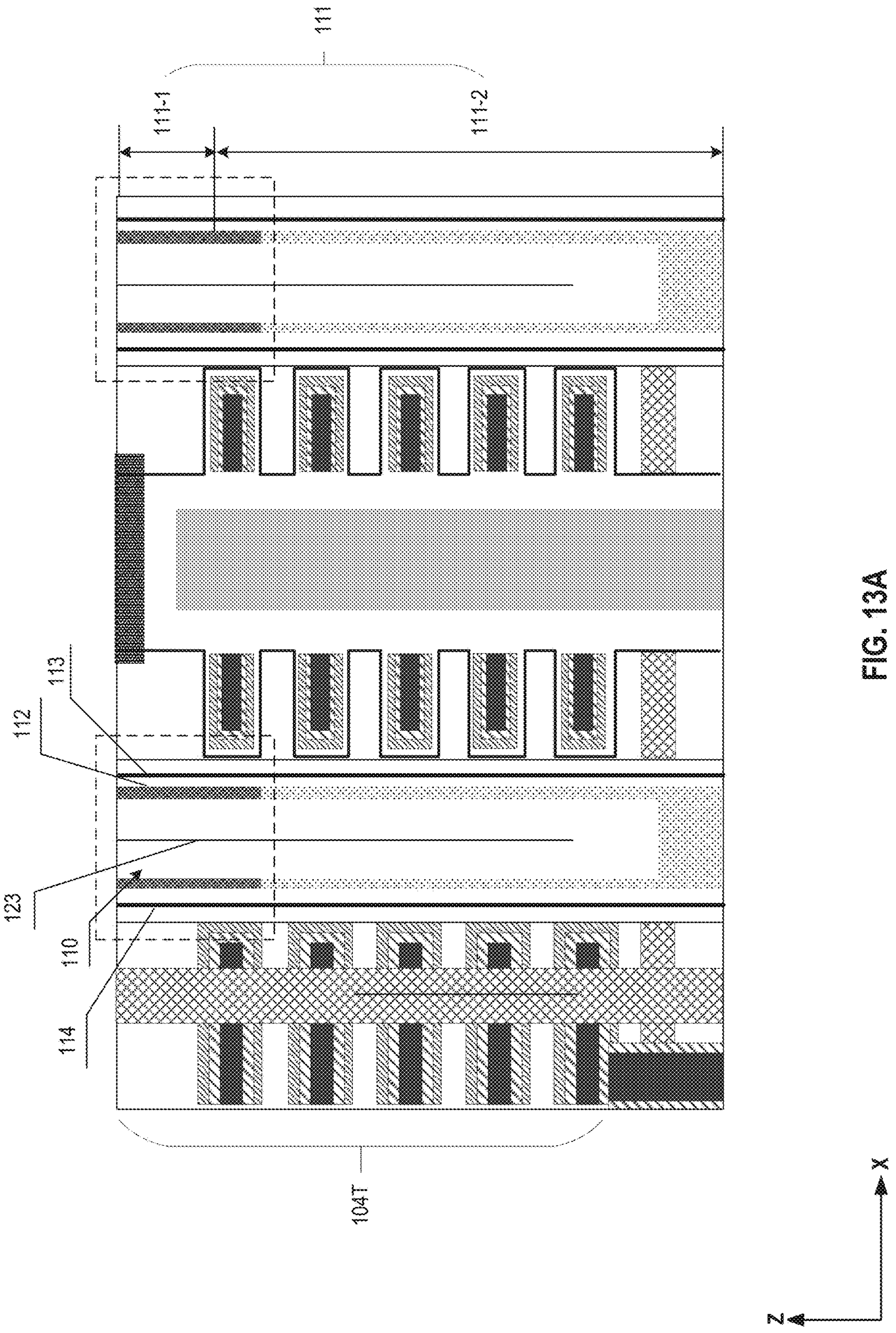

FIG. 13A further shows a partially enlarged view for illustrating the doping profile of channel layer 111 after being doped in FIG. 10. As shown in FIG. 13A, channel layer 111 may include a doped channel layer 111-1 and an undoped channel layer 111-2. Undoped channel layer 111-2 may be located below doped channel layer 111-1. Doped channel layer 111-1 may extend and locate in stack structure 104. It is noted that, by using the ion implantation to dope the channel layer, a doping depth may be an ion implantation depth. As such, the ion implantation depth can be adjusted to control the doping depth of the doped channel layer 111-1 accordingly. It is also noted that the doping depth of the doping channel layer is not limited to the present disclosure, different doping depths, doping concentrations, or doping profiles can be set according to the actual requirements of the memory device. Among them, the doping depth can be controlled by adjusting the acceleration energy of the ion beam. The doping concentration, that is, the impurity dose, can be controlled by monitoring the ion current during implantation. The doping impurity distribution can be adjusted by simultaneously adjusting the ion implantation energy and ion implantation dose to control. Therefore, by using the ion implantation process for doping, the doping concentration, doping depth, and doping impurity distribution can be controlled more accurately with repeatability. In some implementations, the doping concentration of doped channel layer 111-1 can be between $1\times10^{13}$ $cm^{-3}$ and $1\times10^{23}$ $cm^{-3}$ (e.g., $1\times10^{13}$, $1\times10^{14}$, $1\times10^{15}$, $1\times10^{16}$, $1\times10^{17}$, $1\times10^{18}$, $1\times10^{19}$, $1\times10^{20}$, $1\times10^{21}$, $1\times10^{22}$, $1\times10^{23}$, or any range bounded by the lower end by any of these values, or in any range defined by any two of these values). In some implementations, the depth of doped channel layer 111-1 can be between 0 nm and 500 nm (e.g., 50 nm, 100 nm, 150 nm, 200 nm, 250 nm, 300 nm, 350 nm, 400 nm, 450 nm, 500 nm, or any range bounded by the lower end by any of these values, or in any range defined by any two of these values).

In some implementations, doped channel layer 111-1 may be an N-type doped channel layer. Specifically, the N-type doped channel layer may include, for example, polysilicon, single crystal silicon, or amorphous silicon. The N-type doped channel layer may include a pentavalent impurity element such as phosphorus (P), arsenic (As), or antimony (Tb) as an N-type dopant. Since only four valence electrons in the pentavalent impurity atom can form covalent bonds with the valence electrons in the surrounding four semiconductor atoms, the extra valence electron can easily form a free electron because it is not bound by covalent bonds. Therefore, the N-type doped channel layer can provide free electrons. In some implementations, an ion implantation process is employed to dope the upper end of the channel layer with any suitable N-type dopant to a desired doping depth and doping concentration.

Figure 13B:
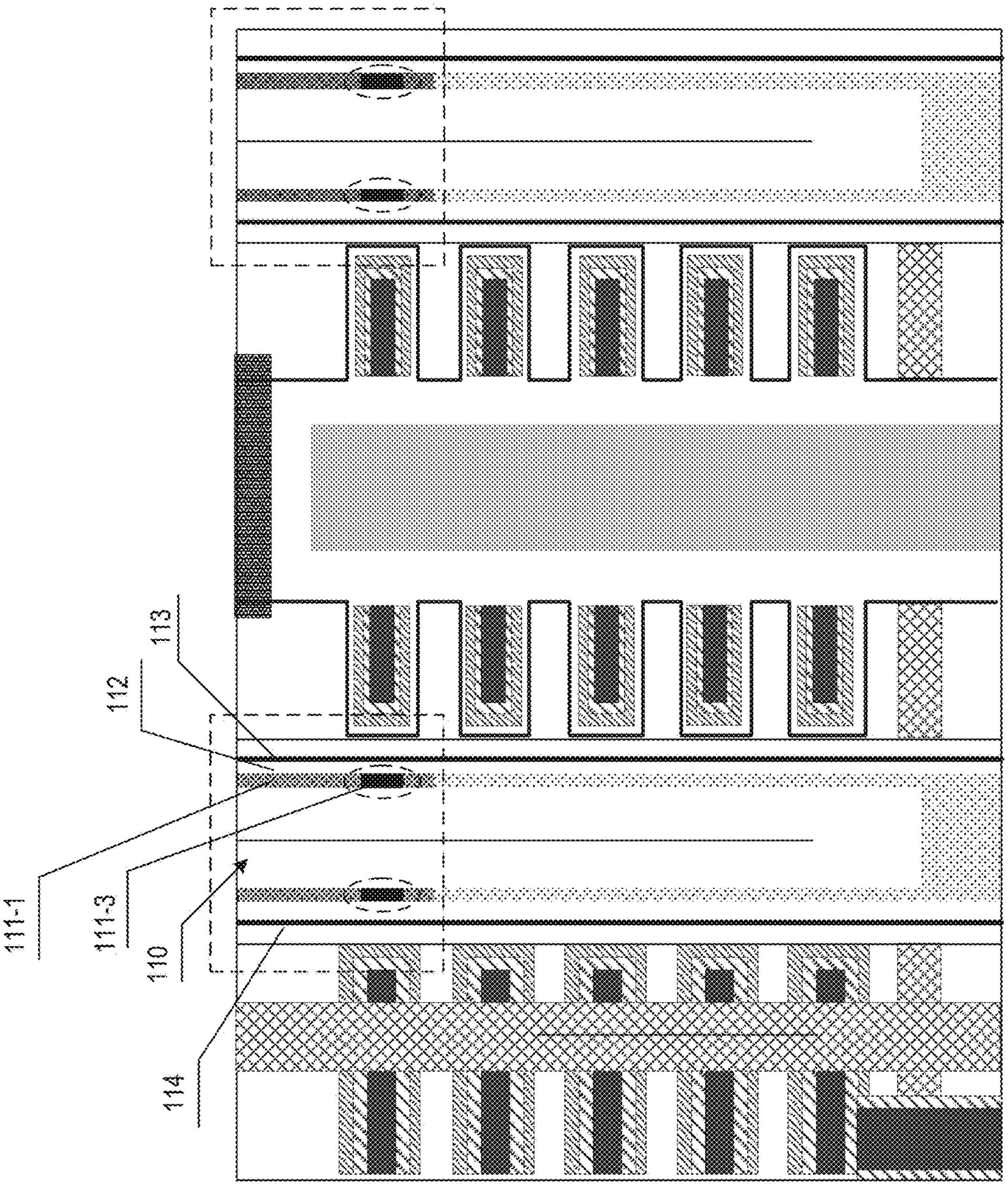
Figure 13C:
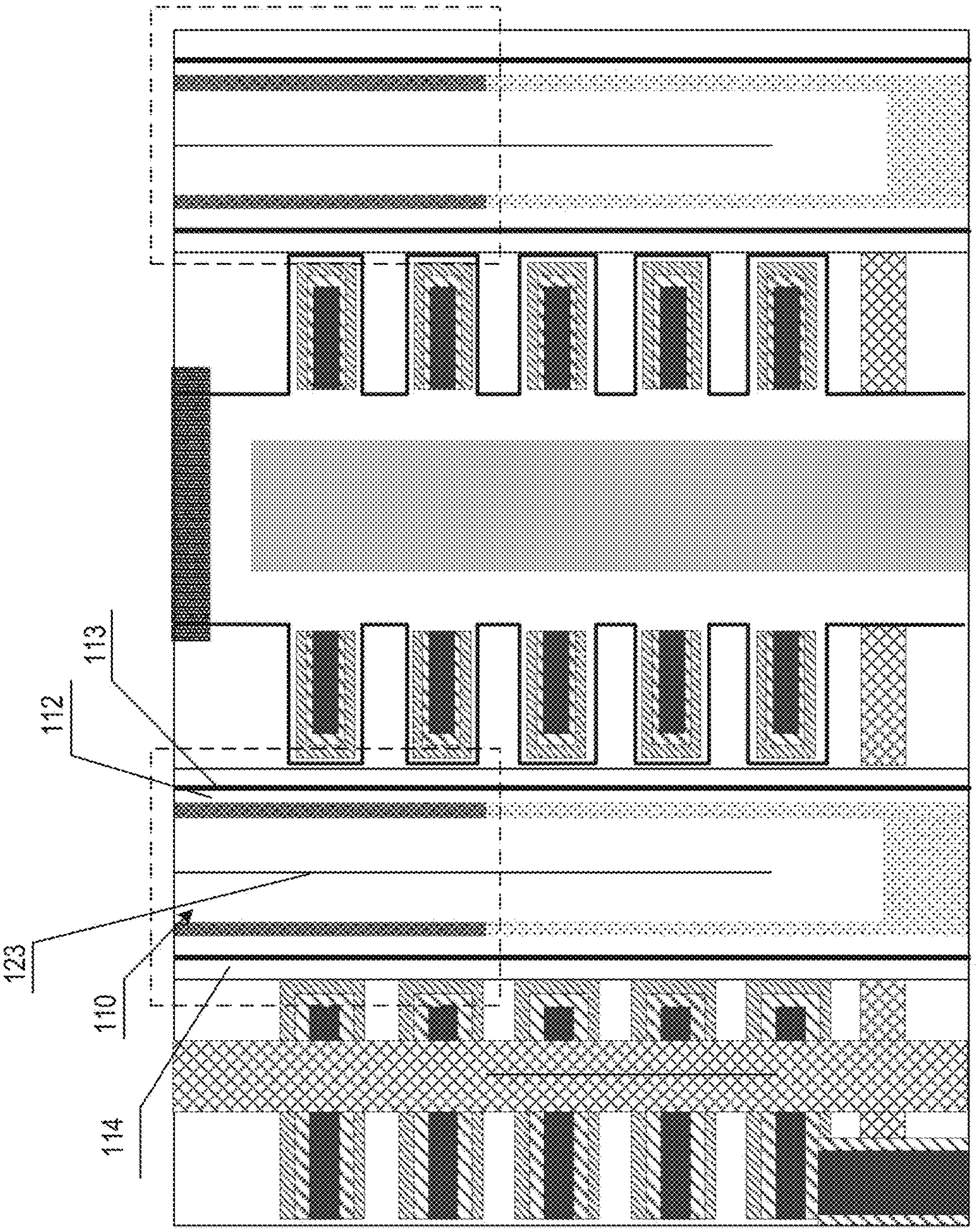
Figure 13F:
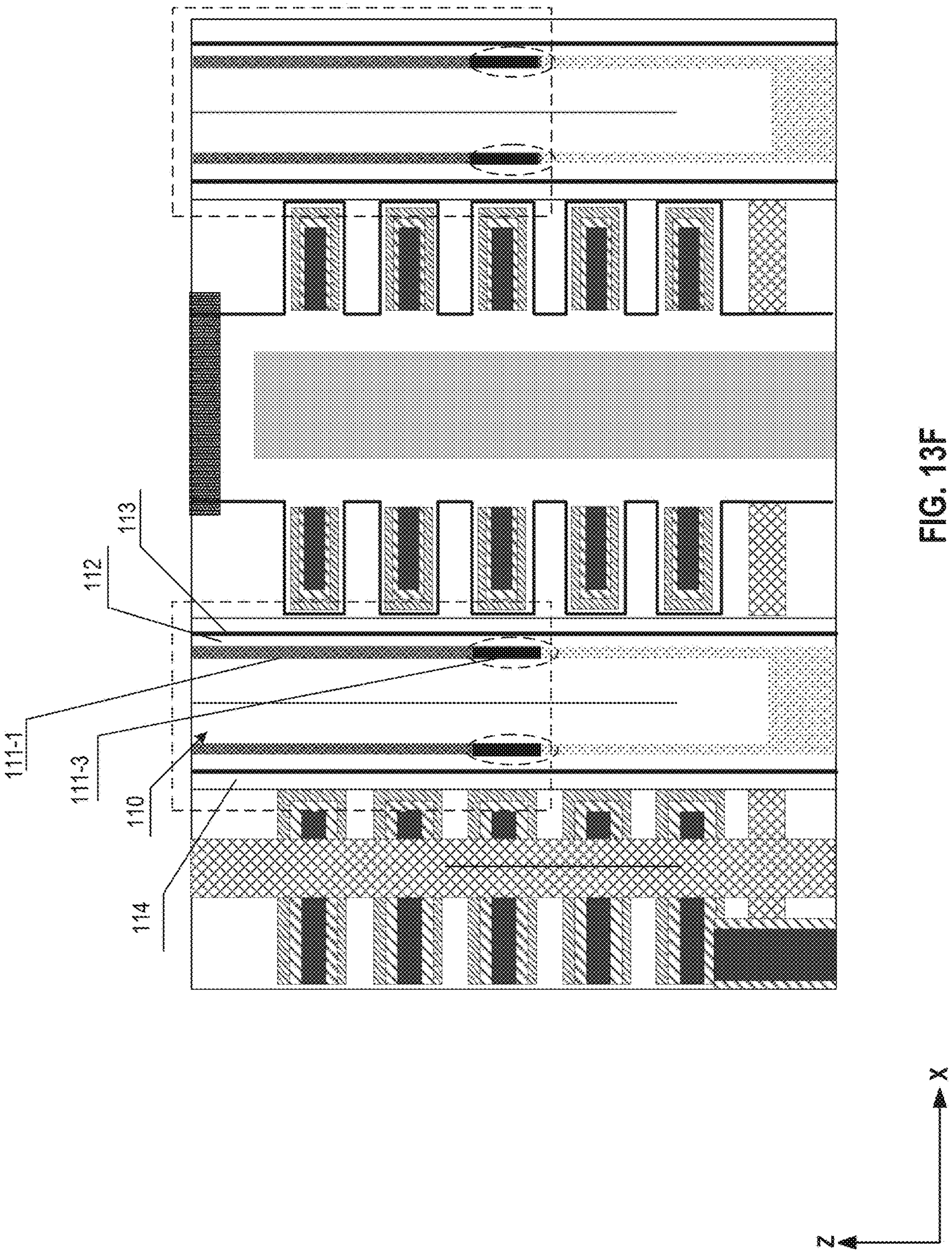

In some implementations, as shown by the dotted boxes in FIGS. 13A to 13F, channel layer 111 is doped by an ion implantation process, and the ion implantation energy is controlled to make the ion implantation depths different; that is, the doping depths are different. As shown in FIG. 13A, doped channel layer 111-1 in stack structure 104 extends in the z-direction and to a depth of the uppermost gate layer. As shown in FIG. 13B, beyond doped channel layer 111-1, a heavily doped channel layer 111-3 can also be formed in the depth of the uppermost gate layer. It is noted that a doping concentration of heavily doped channel layer 111-3 is higher than that of doped channel layer 111-1. As such, the GIDL effect can be enhanced. Also, as shown in FIG. 13C, doped channel layer 111-1 in stack structure 104 extends in the z-direction and to a depth of two consecutively arranged gate layers. As shown in FIG. 13D, beyond doped channel layer 111-1, heavily doped channel layer 111-3 can also be formed in the depth of the second uppermost gate layer. Also, as shown in FIG. 13E, doped channel layer 111-1 in stack structure 104 extends in the z-direction and to a depth of three consecutively arranged gate layers. As shown in FIG. 13F, beyond doped channel layer 111-1, heavily doped channel layer 111-3 can also be formed in the depth of third uppermost gate layer. By controlling the location of heavily doped channel layer 111-3 to correspond to the location of the specific gate layer, it can enhance the GIDL effect of specific or all the memory cells.

As shown in FIG. 10, the channel layer in the channel hole is doped to form a doped channel layer 111-1, and at this time, doped channel layer 111-1 is all located in stack structure 104. In some implementations, doped channel layer 111-1 may be doped using an ion implantation process. Also, a second air gap 123 in the middle position of channel structure 110 is formed and extending in the vertical direction (e.g., z-direction). The process of doping the channel layer may slightly affect second air gap 123 in the channel hole. Moreover, in the subsequent process of forming the doped semiconductor layer through the in-situ growth process, the air gap in the channel hole may also be affected. Here, second air gap 123 is an open cavity formed by being at least partially surrounded by the filler in the channel hole.

As illustrated in FIG. 11, a doped semiconductor layer 115 covering the end of channel structure 110 and stack structure 104 is formed. In some implementations, doped semiconductor layer 115 may be an N-type doped semiconductor layer. Specifically, the N-type doped semiconductor layer may include, for example, polysilicon, single crystal silicon, or amorphous silicon. In some implementations, one or more thin film deposition processes including, but not limited to, CVD, PVD, ALD, or any combination thereof, may be used to form polysilicon overlying the end of channel structure 110 and stack structure 104. The polysilicon is then doped with N-type dopants using an ion implantation process, and doped semiconductor layer 115 is formed thereafter. In some implementations, an in-situ growth process may be used to form the doped semiconductor layer. Specifically, doped channel layer 111-1 is not partially located in doped semiconductor layer 115 in the present embodiment but is only located in stack structure 104. In some implementations, doped semiconductor layer 115 may be partially formed in second air gap 123. In some implementations, the doping concentration of doped semiconductor layer 115 can be between $1\times10^{13}$ $cm^{-3}$ and $1\times10^{23}$ $cm^{-3}$ (e.g., $1\times10^{13}$, $1\times10^{14}$, $1\times10^{15}$, $1\times10^{16}$, $1\times10^{17}$, $1\times10^{18}$, $1\times10^{19}$, $1\times10^{20}$, $1\times10^{21}$, $1\times10^{22}$, $1\times10^{23}$, or any range bounded by the lower end by any of these values, or in any range defined by any two of these values).

In some implementations, doped channel layer 111-1 (e.g., including heavily doped channel layer 111-3 as in FIGS. 13B, 13D, and 13F) and doped semiconductor layer 115 are activated, so that doped channel layer 111-1 and doped semiconductor layer 115 have the same doping concentration. That is, after the activation treatment, doped channel layer 111-1 and doped semiconductor layer 115 may have the same doping concentration. By doing so, when an erasing operation is performed, an electron current path is formed between the N-type doped semiconductor layer (e.g., 115) and the doped channel layer (e.g., 111-1), and electrons are supplied to the memory strings. Under the condition that the doping concentration of the doped channel layer and the doped semiconductor layer is the same or at least at the same magnitude (e.g., the difference between two doping concentrations is less than an order), the same GIDL voltage can be applied to different memory cells on the memory string, so that the GIDL current with substantially the same magnitude can be realized. This can increase erase speed, reduce current consumption, and/or reduce power consumption.

The activation treatment may include a thermal activation treatment or a laser activation treatment. It should be noted that the temperature of laser activation treatment is lower than that of a thermal activation treatment. In practical applications, the activation treatment process can be selected according to actual needs, so as to avoid the influence of the activation treatment temperature on the subsequent process.

After forming the doped semiconductor layer, as shown in FIG. 12, a TSC opening and a source contact opening can be formed on the doped semiconductor layer. And then, the TSC opening and the source contact opening are filled with conductive material to form TSC 116 and source contact 117. TSC 116 can be in contact with one end of peripheral contact 107. As shown in FIG. 12, a dielectric material layer 118 is formed on doped semiconductor layer 115, and then the TSC openings and the source contact openings are formed through dielectric material layer 118 into doped semiconductor layer 115. In some implementations, the source contact opening may extend further into an upper portion of doped semiconductor layer 115. That is, the upper portion of doped semiconductor layer 115 may continue to be etched after the etch process has passed through dielectric material layer 118. In some implementations, the source contact openings are formed using a wet etch/dry etch process. In some implementations, different etching processes may be used for etching through dielectric material layer 118 and etching doped semiconductor layer 115.

Still referring to FIG. 12, on the backside of doped semiconductor layer 115, the source contact openings are filled with conductive material to form source contacts 117. In particular, one or more conductive materials may be deposited into the source contact openings using one or more thin film deposition processes such as CVD, PVD, ALD, any other suitable process, or a combination thereof, to utilize adhesive compound and conductive layer to fill the source contact openings. Then, a planarization process, e.g., a CMP process, may be performed to remove excess conductive material such that the upper surface of the source contact is flush with the top surface of dielectric material layer 118. In some implementations, source contact 117 is electrically connected to channel structure 110 through doped semiconductor layer 115. Source contact 117 may or may not be directly above channel structure 110, as long as source contact 117 can be electrically connected to channel structure 110 through doped semiconductor layer 115. A third interconnection layer 119 is formed above source contact 117. Third interconnection layer 119 may be electrically connected to source contact 117 via the source contact openings and connected to peripheral contact 107 via the TSC openings to realize the fan-out pad. For example, electrical signals can be communicated between first semiconductor structure 100 and second semiconductor structure 200 from third interconnection layer 119 to transistors 211 via peripheral contact 107, first bonding layer 102, and second bonding layer 202. In some implementations, photolithography is used to pattern the TSC openings in alignment with peripheral contacts 107, and to pattern the source contact openings in alignment with channel structure 110. Etching of the TSC openings may stop at the upper end of peripheral contacts 107, and etching of the source contact openings may stop at the upper end of channel structure 110.

FIGS. 14A-14B illustrate exemplary 3D memory devices, according to some aspects of the present disclosure. As shown in FIGS. 14A, a first semiconductor structure 100 and a second semiconductor structure 200 that are bonded to each other are provided. First semiconductor structure 100 includes a stack structure 104, a doped semiconductor layer 115 on stack structure 104, a dielectric material layer 118 on doped semiconductor layer 115, a third interconnection layer 119 on dielectric material layer 118. In some implementations, stack structure 104 includes a dielectric stack having interleaved stack dielectric layers 106 and stack conductive layers (e.g., polysilicon layers).

Also, as illustrated in FIG. 14A, a plurality of transistors 211 are formed on a second substrate 201 using a plurality of processes including, but not limited to, photolithography, etching, thin film deposition, thermal growth, implantation, CMP, and any other suitable processes. Second substrate 201 can include silicon (e.g., single crystalline silicon, c-Si), SiGe, GaAs, Ge, SOI, or any other suitable materials. In some implementations, doped regions (not shown) are formed in second substrate 201 by ion implantation and/or thermal diffusion, which function, for example, as source regions and/or drain regions of transistors 211. In some implementations, isolation regions (e.g., STIs) are also formed in second substrate 201 by wet etching and/or dry etching and thin film deposition. Transistors 211 can form peripheral circuits on second substrate 201. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some implementations. It is understood that in some implementations, the peripheral circuits may further include any other circuits compatible with the advanced logic processes including logic circuits, such as processors and PLDs, or memory circuits, such as SRAM and DRAM.

As illustrated in FIG. 14A, a second bonding layer 202 is formed above peripheral circuits. And a first bonding layer 102 is formed below memory circuits. First and second bonding layers 102, 202 may include bonding contacts electrically connected to peripheral circuits or memory circuits, respectively. To form first and second bonding layer 102, 202, an ILD layer is deposited using one or more thin film deposition processes, such as CVD, PVD, ALD, or any combination thereof; the bonding contacts through the ILD layer are formed using wet etching and/or dry etching, e.g., RIE, followed by one or more thin film deposition processes, such as ALD, CVD, PVD, any other suitable processes, or any combination thereof. Second semiconductor structure 200 can be bonded to first semiconductor structure 100 in a face-to-face manner at a bonding interface. In some implementations, the bonding interface is disposed between bonding layers 102 and 202 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, the bonding interface is the place at which bonding layers 102 and 202 are met and bonded. In practice, the bonding interface can be a layer with a certain thickness that includes the bottom surface of bonding layer 102 of first semiconductor structure 100 and the top surface of bonding layer 202 of second semiconductor structure 200.

In some implementations, first semiconductor structure 100 of 3D memory device 150 further includes interconnect layers and contacts (e.g., peripheral contact 107 and memory interconnect layer 108) above peripheral circuits to transfer electrical signals to and from peripheral circuits. Peripheral contact 107 extends vertically outside of stack structure 104. A depth of peripheral contact 107 can be larger than that of stack structure 104. Peripheral contact 107 can further extend into doped semiconductor layer 115. Peripheral contact 107 can be connected to peripheral circuits in second semiconductor structure 200 via bonding layers 102 and 202. The interconnect layer can include a plurality of interconnects (also referred to herein as contacts), including lateral interconnect lines and VIA contacts. As used herein, the term interconnects can broadly include any suitable types of interconnects, such as MEOL interconnects and BEOL interconnects. The interconnect layer can further include one or more ILD layers (a.k.a. IMD layers) in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, W, Co, Cu, Al, silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

In some implementations, the 3D memory device is a NAND Flash memory device in which memory cells are provided in the form of an array of NAND memory strings. Each NAND memory string can include a respective channel structure 110. As shown in FIG. 14A, each channel structure 110 can extend vertically into a plurality of pairs of interleaved stack conductive layers 105 and stack dielectric layers 106. The interleaved stack conductive layers 105 and stack dielectric layers 106 are part of stack structure 104. The number of the pairs of stack conductive layers 105 and stack dielectric layers 106 in stack structure 104 determines the number of memory cells in the 3D memory device. It is understood that in some implementations, stack structure 104 may have a multi-deck architecture (not shown), which includes a plurality of stack structures 104 stacked over one another. The numbers of the pairs of stack conductive layers 105 and stack dielectric layers 106 in each stack structure 104 can be the same or different.

Stack structure 104 can include a plurality of interleaved stack conductive layers 105 and stack dielectric layers 106. Stack conductive layers 105 and stack dielectric layers 106 in stack structure 104 can alternate in the vertical direction. In other words, except the ones at the top or bottom of stack structure 104, each stack conductive layer 105 can be adjoined by two stack dielectric layers 106 on both sides, and each stack dielectric layer 106 can be adjoined by two stack conductive layers 105 on both sides. Stack conductive layers 105 can include conductive materials including, but not limited to, W, Co, Cu, Al, polysilicon, doped silicon, silicides, or any combination thereof. Each stack conductive layer 105 can include a gate electrode (gate line) surrounded by an adhesive layer and a gate dielectric layer. The gate electrode of stack conductive layer 105 can extend laterally as a word line, ending at one or more staircase structures of stack structure 104. Stack dielectric layers 106 can include dielectric materials including, but not limited to, silicon oxide, silicon nitride, silicon oxynitride, or any combination thereof.

In some implementations, each channel structure 110 includes a channel hole filled with a channel layer 111 (e.g., as a semiconductor channel) and a composite dielectric layer (e.g., as a memory film). In some implementations, channel layer 111 includes silicon, such as amorphous silicon, polysilicon, or single crystalline silicon. In some implementations, the memory film is a composite layer including a tunneling layer 112, a storage layer 113, and a blocking layer 114. As shown in FIG. 14A, the remaining space of the channel hole can be partially filled with a capping layer including dielectric materials, such as silicon oxide, and/or an air gap (not shown). Channel structure 110 can have a cylinder shape (e.g., a pillar shape). The capping layer, the channel layer 111, the tunneling layer, the storage layer, and the blocking layer of the memory film are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, the memory film can include a composite layer of silicon oxide/silicon oxynitride/silicon oxide (ONO).

In some implementations, source contact 117 (a.k.a channel plug) is electrically connected to channel structure 110 through doped semiconductor layer 115. Source contact 117 may or may not be directly above channel structure 110, as long as source contact 117 can be electrically connected to channel structure 110 through doped semiconductor layer 115. In some implementations, a wet etch/dry etch process may be used to form the TSC openings and source contact openings extending through dielectric material layer 118 and doped semiconductor layer 115. A third interconnection layer 119 is formed above source contact 117. Third interconnection layer 119 may be electrically connected to source contact 117 via the source contact openings and connected to peripheral contact 107 via the TSC openings to realize the fan-out pad. For example, electrical signals can be communicated between first semiconductor structure 100 and second semiconductor structure 200 from third interconnection layer 119 to transistors 211 via peripheral contact 107, first bonding layer 102, and second bonding layer 202. In some implementations, photolithography is used to pattern the TSC openings in alignment with peripheral contacts 107, and to pattern the source contact openings in alignment with channel structure 110. Etching of the TSC openings may stop at the upper end of peripheral contacts 107, and etching of the source contact openings may stop at the upper end of channel structure 110.

FIG. 14B illustrates another exemplary 3D memory device 250, which is similar to 3D memory device 150 except for the different doping profiles of the channel layer. It is understood that the details of other same structures in both 3D memory devices 150 and 250 are not repeated for ease of description. As shown in FIG. 14B, doped channel layer 111-1 include a heavily doped channel layer 111-3. Heavily doped channel layer 111-3 may be located in a first position 111-31, a second position 111-33, or a third position 111-35. First position 111-31 laterally corresponds to a position of a first uppermost gate layer, second position 111-33 laterally corresponds to a position of a second uppermost gate layer, and third position 111-35 laterally corresponds to a position of a third uppermost gate layer.

FIG. 16 illustrates a block diagram of an exemplary system 1600 having a 3D memory device, according to some aspects of the present disclosure. System 1600 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 16, system 1600 can include a host 1608 and a memory system 1602 having one or more 3D memory devices 1604 and a memory controller 1606. Host 1608 can be a processor of an electronic device, such as a central processing unit (CPU), or a system-on-chip (SoC), such as an application processor (AP). Host 1608 can be configured to send or receive data to or from 3D memory devices 1604.

3D memory device 1604 can be any 3D memory devices disclosed herein, such as 3D memory devices 150 and 250 shown in FIGS. 14A and 14B. In some implementations, each 3D memory device 1604 includes a NAND Flash memory. Consistent with the scope of the present disclosure, the channel layer 111 of 3D memory device 1604 can be partially doped such that part of the channel layer 111 that forms the source contact is highly doped to lower the potential barrier while leaving another part of the channel layer 111 that forms the memory cells remaining undoped or lowly doped. One end of each channel structure of 3D memory device 1604 can be opened from the backside to expose the doped part of the respective channel layer 111. 3D memory device 1604 can further include a doped semiconductor layer electrically connecting the exposed doped parts of the channel layer 111 to further reduce the contact resistance and sheet resistance. As a result, the electric performance of 3D memory device 1604 can be improved, which in turn improves the performance of memory system 1602 and system 1600, e.g., achieving higher operation speed.

Memory controller 1606 is coupled to 3D memory device 1604 and host 1608 and is configured to control 3D memory device 1604, according to some implementations. Memory controller 1606 can manage the data stored in 3D memory device 1604 and communicate with host 1608. In some implementations, memory controller 1606 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1606 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1606 can be configured to control operations of 3D memory device 1604, such as read, erase, and program operations. Memory controller 1606 can also be configured to manage various functions with respect to the data stored or to be stored in 3D memory device 1604 including, but not limited to bad-block management, garbage collection, logical-to-physical address conversion, wear leveling, etc. In some implementations, memory controller 1606 is further configured to process error correction codes (ECCs) with respect to the data read from or written to 3D memory device 1604. Any other suitable functions may be performed by memory controller 1606 as well, for example, formatting 3D memory device 1604. Memory controller 1606 can communicate with an external device (e.g., host 1608) according to a particular communication protocol. For example, memory controller 1606 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 1606 and one or more 3D memory devices 1604 can be integrated into various types of storage devices, for example, be included in the same package, such as a universal Flash storage (UFS) package or an eMMC package. That is, memory system 1602 can be implemented and packaged into different types of end electronic products. In one example as shown in FIG. 17A, memory controller 1606 and a single 3D memory device 1604 may be integrated into a memory card 1702. Memory card 1702 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 1702 can further include a memory card connector 1704 electrically coupling memory card 1702 with a host (e.g., host 1608 in FIG. 16). In another example as shown in FIG. 17B, memory controller 1606 and multiple 3D memory devices 1604 may be integrated into an SSD 1706. SSD 1706 can further include an SSD connector 1708 electrically coupling SSD 1706 with a host (e.g., host 1608 in FIG. 16). In some implementations, the storage capacity and/or the operation speed of SSD 1706 is greater than those of memory card 1702.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:

a stack structure comprising interleaved dielectric layers and conductive layers along a first direction;

a channel structure extending through the stack structure; and a doped semiconductor layer located on a side of the stack structure in the first direction, wherein the channel structure comprises a channel layer having a doped channel layer and an undoped channel layer, wherein the channel structure comprises a filling layer surrounded by the channel layer and an air gap surrounded by the filling layer, and the air gap overlaps with the doped channel layer in a plane orthogonal to a second direction, and the second direction is perpendicular to the first direction.

2. The 3D memory device of claim 1, wherein an end of the doped channel layer extends in the doped semiconductor layer.

3. The 3D memory device of claim 1, wherein a doping concentration of the doped channel layer and a doping concentration of the doped semiconductor layer are the same.

4. The 3D memory device of claim 1, wherein a doping concentration of the doped channel layer and a doping concentration of the doped semiconductor layer each is between $10^{13}$ $cm^{-3}$ and $10^{23}$ $cm^{-3}$.

5. The 3D memory device of claim 1, wherein the doped channel layer comprises at least two different doping concentration portions.

6. The 3D memory device of claim 1, wherein the doped channel layer comprises a first doping portion and a second doping portion, a doping concentration of the first doping portion is higher than that of the second doping portion.

7. The 3D memory device of claim 6, wherein the first doping portion overlaps with at least one of the conductive layers in a plane orthogonal to the second direction.

8. The 3D memory device of claim 1, wherein the channel structure extending in the stack structure further comprises a storage film, the storage film at least partially surrounds the channel layer, and the storage film comprises a tunneling layer, a storage layer, and a blocking layer arranged radially from inside out.

9. The 3D memory device of claim 1, further comprising:

first contacts; and second contacts being in contact with the doped semiconductor layer, wherein the doped semiconductor layer is located between the second contacts and the stack structure along the first direction, the first contacts are in contact with ends of peripheral contacts, and the second contacts are electrically connected to the channel layer.

10. The 3D memory device of claim 1, further comprising:

a first semiconductor structure comprising:

the stack structure;

the channel structure; and the doped semiconductor layer; and a second semiconductor structure bonding to the first semiconductor structure.

11. The 3D memory device of claim 10, wherein the first semiconductor structure further comprises a first bonding layer, wherein the second semiconductor structure comprises:

peripheral circuits; and a second bonding layer, wherein the first semiconductor structure and the second semiconductor structure are bonded via the first bonding layer and the second bonding layer.

12. The 3D memory device of claim 7, wherein the second doping portion overlaps with at least two or more of the conductive layers in a plane orthogonal to the second direction, and the first doping portion overlaps with at least one of the conductive layers farthest from the doped semiconductor layer.

13. The 3D memory device of claim 1, wherein a doping type of the doped channel layer is the same as a doping type of the doped semiconductor layer.

14. The 3D memory device of claim 1, wherein the doped channel layer comprises a first portion and a second portion contacting the first portion, the first portion lies within the doped semiconductor layer, and the second portion lies within the stacked structure, wherein the second portion comprises a first end and a second end opposite to the first end in the first direction, wherein the first end is closer to the doped semiconductor layer than the second end, and a surface of the second end is located in the stack structure.

15. The 3D memory device of claim 1, wherein the air gap overlaps with at least one of the conductive layers in a plane orthogonal to a second direction, and the second direction is perpendicular to the first direction.

16. The 3D memory device of claim 9, wherein at least one of the second contacts arranged in alignment with a position of the doped channel layer.

17. The 3D memory device of claim 1, further comprising:

a channel plug arranged in alignment with a position of the doped channel layer.

18. The 3D memory device of claim 17, wherein the channel plug is electrically connected to the channel structure through the doped semiconductor layer.

19. The 3D memory device of claim 1, wherein the air gap overlaps with at least one of the conductive layers nearest to the doped semiconductor layer.

20. A system, comprising:

a memory system comprising:

one or more three-dimensional (3D) memory devices comprising:

a stack structure comprising interleaved dielectric layers and conductive layers along a first direction;

a channel structure extending through the stack structure; and a doped semiconductor layer located on a side of the stack structure in the first direction, wherein the channel structure comprises a channel layer having a doped channel layer and an undoped channel layer, wherein the channel structure comprises a filling layer surrounded by the channel layer and an air gap surrounded by the filling layer, and the air gap overlaps with the doped channel layer in a plane orthogonal to a second direction, and the second direction is perpendicular to the first direction; and a memory controller configured to control operations of the 3D memory devices; and a host configured to send or receive data to or from the 3D memory devices.

* * * * *